United States Patent
Tsorng et al.

(10) Patent No.: US 12,317,438 B2
(45) Date of Patent: May 27, 2025

(54) DUST-PROOF MECHANISM FOR MEMORY MODULE

(71) Applicant: Quanta Computer Inc., Taoyuan (TW)

(72) Inventors: Yaw-Tzorng Tsorng, Taoyuan (TW); Tung-Hsien Wu, Taoyuan (TW); Yu-Ying Tseng, Taoyuan (TW); Hsiang-Pu Ni, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 479 days.

(21) Appl. No.: 17/860,529

(22) Filed: Jul. 8, 2022

(65) Prior Publication Data

US 2024/0015912 A1    Jan. 11, 2024

(51) Int. Cl.
*H05K 5/00*   (2025.01)
*H05K 5/02*   (2006.01)
*H05K 5/03*   (2006.01)

(52) U.S. Cl.
CPC ............. *H05K 5/03* (2013.01); *H05K 5/0047* (2013.01); *H05K 5/0213* (2013.01); *H05K 2201/10159* (2013.01)

(58) Field of Classification Search
CPC ........ H05K 5/03; H05K 1/182; H05K 5/0047; H05K 5/0213; H05K 2201/10159; H05K 7/20409; H05K 7/20536; H05K 7/1487; G06F 1/20; G06F 1/185
See application file for complete search history.

(56) References Cited

U.S. PATENT DOCUMENTS

| | | | | |
|---|---|---|---|---|
| 7,221,569 B2* | 5/2007 | Tsai | .................... | H01L 23/4093 361/710 |
| 7,684,197 B2* | 3/2010 | Zhu | .................... | H01L 23/4093 165/185 |
| 8,018,723 B1* | 9/2011 | Yu | ........................ | H01L 23/367 361/720 |
| 8,044,506 B2* | 10/2011 | Yun | ...................... | H01L 23/467 174/15.1 |
| 9,405,338 B2* | 8/2016 | Demange | .................. | G06F 1/20 |
| 10,499,488 B1* | 12/2019 | Tsai | ...................... | H05K 1/144 |
| 2003/0026076 A1* | 2/2003 | Wei | ........................ | H01L 23/36 257/E23.101 |
| 2006/0171126 A1* | 8/2006 | Tzu | ....................... | H05K 5/0282 361/752 |
| 2007/0263353 A1* | 11/2007 | McGuff | ................... | G06F 1/20 361/688 |

(Continued)

*Primary Examiner* — Sagar Shrestha
(74) *Attorney, Agent, or Firm* — NIXON PEABODY LLP

(57) ABSTRACT

A dust-proof telecommunication system and a method for assembling a dust-proof mechanism are disclosed. The system includes a chassis including an opening on a top side thereof; a PCB located within the chassis; a memory module removably installed on the PCB; and a cover removably coupled to the top side of the chassis. The opening is positioned and shaped such that the memory module is accessible via the opening for easy replacement. The method includes inserting a strip into the opening such that a space is formed between a wall of the opening and the strip; and inserting the memory module into the space formed between the wall of the opening and the strip such that another strip located at a first side of the memory module contacts the wall and the strip contacts a second side of the memory module. The memory module is replaceably coupled to the PCB.

20 Claims, 27 Drawing Sheets

(56) References Cited

U.S. PATENT DOCUMENTS

| | | | |
|---|---|---|---|
| 2008/0174965 A1* | 7/2008 | Hsu | H05K 7/2049 361/704 |
| 2011/0248612 A1* | 10/2011 | Peng | G06F 1/188 312/294 |
| 2013/0120926 A1* | 5/2013 | Barina | H01L 23/473 165/80.4 |
| 2013/0182389 A1* | 7/2013 | Demange | G06F 1/206 361/679.54 |
| 2014/0146461 A1* | 5/2014 | Choi | G06F 1/203 361/752 |
| 2014/0326436 A1* | 11/2014 | Czamara | H05K 7/20727 165/80.2 |
| 2020/0375056 A1* | 11/2020 | Curtis | H05K 7/1487 |
| 2021/0274684 A1* | 9/2021 | Ni | H05K 7/20145 |

* cited by examiner

DUST-PROOF MECHANISM FOR MEMORY MODULE

FIELD OF THE INVENTION

The present invention relates generally to a dust-proof telecommunication system, and more specifically, to a dust-proof mechanism for memory module.

BACKGROUND OF THE INVENTION

Telecommunication devices, such as 5G equipment, base stations for cellular networks and servers, typically have compartments for holding various components such as a Printed Circuit Board Assembly (PCBA), a central processing unit (CPU), a system on chip (SoC), a memory module, and an on-board chip. Since telecommunication devices are generally set up in the outdoor environment, the components are protected from adverse environmental conditions and unauthorized access by a protective cover covering the compartments, such as die casting.

Further, telecommunication devices in harsh locations face a host of challenges, including heavy dust, poor airflow, and extreme temperatures. Outdoor environments or infrequently accessed storage closets with poor airflow can introduce excess dust into server hardware, eventually causing failures. In general, a cooling plate or die-cast heat sink with a fin structure or fins is designed to dissipate heat generated from the components of the server hardware.

With the vigorous development of the Internet and IOT (Internet of Things), the requirements for signal speed are getting higher and higher. The number of server nodes is bound to increase in response to high-speed signal requirements, and some servers are placed in harsh environments. In this condition, water-proof and dust-proof functions are particularly important. The conventional memory dust-proof mechanism is shown in FIGS. 1A and 1B.

Referring to FIGS. 1A and 1B showing the conventional telecommunication system the dust-proof mechanism for memory 12, such as DIMMs to cover the entire Printed Circuit Board (PCB) 14 with die casting 13, and the memory is directly welded to the PCB. Due to dust-proof requirements, the PCB 14 is completely covered by the die casting 13, as shown in FIG. 1B, and there is no airflow through the space near the memory 12. In this case, the heat dissipation of the memory 12 needs to be conducted by the die casting 13 which contacts the memory to conduct the heat generated by the memory to the die casting such that the heat is carried away by the external air flow. Using such a conventional dust-proof mechanism has the following problem: if the memory 12 is damaged, the entire PCB 14 must be replaced because the memory is directly welded to the PCB. When there is a limited space on the PCB 14 board, it can only support a limited number of memories 12. The above described problems will have many restrictions on memory replacement/repair and the design of the PCB board.

Therefore, a need exists for an improved dust-proof mechanism that allows the airflow to pass through two sides of the DIMM or DIMM module. The present disclosure is directed to such a dust-proof telecommunication system that provides easy solution for the heat dissipation problem, at the same time, ensuring easy replaceability of the memory and reducing the area occupied by the PCB.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a telecommunication system is disclosed. For example, the telecommunication system is dust-proof. According to various embodiments, the telecommunication system includes a chassis comprising an opening on a top side thereof; a printed circuit board (PCB) located within the chassis; a memory module removably installed on the PCB. The opening is positioned and shaped such that the memory module is accessible via the opening. The telecommunication system further includes a cover removably coupled to the top side of the chassis such that the opening is covered by the cover.

In some examples, the memory module includes a dual in-line memory module (DIMM), a first sheet covering a first side of the DIMM, and a second sheet covering a second side of the DIMM opposite the first side. The DIMM is positioned between the first sheet and the second sheet. The memory module further includes a clip inserted into a gap formed at a top side of the memory module between the first sheet and the second sheet.

In some examples, the memory module further includes a first thermal pad coupled to an inner side of the first sheet and a second thermal pad coupled to an inner side of the second sheet. The DIMM is positioned between the first thermal pad and the second thermal pad.

In some examples, the memory module further includes a first strip coupled to the clip. The first strip is placed over a portion of the first sheet when the clip is inserted into the gap to form the memory module. Further, in some examples, a latch of a connector of the DIMM is exposed via a side gap of the memory module formed between the first sheet and the second sheet. Furthermore, in some examples, the opening has a wall and is sized to receive a second strip.

In some examples, the opening is further sized to receive the memory module. The first strip located on a first side of the memory module contacts the wall and the second strip contacts a second side of the memory module opposite the first side of the memory module.

In some examples, the opening is further sized to receive another memory module in addition to the second strip. For example, the memory module is a first memory module and the another memory module is a second memory module. The first memory module includes the first strip and is in contact with the second strip. A gap between the first memory module and the second memory module is blocked by the first strip. A third strip of the second memory module is in contact with the wall. Further, in some examples, the first strip, the second strip, and the third strip are made of a rubber material or a sponge material. Furthermore, in some examples, the opening is further sized to receive a plastic cover. The plastic cover encloses a first latch of a connector that is included in the memory module, the plastic cover further enclosing a second latch of a connector included in the second memory module. The plastic cover encloses the first latch and the second latch when the plastic cover is moved to contact the first and second memory modules.

In some examples, a first rubber or sponge is coupled to the plastic cover and is in contact with the first and second memory modules. A second rubber or sponge is coupled to the plastic cover and has a plurality of cuts such that airflow is allowed through the cuts toward the first and second memory modules. The second rubber or sponge blocks entry of dust to the first and second memory modules.

In some examples, the first sheet, the second sheet, the clip, and the cover are made of a metal material. Further, in some examples, a plurality of holes is formed on the clip.

In some examples, a plurality of protrusions is formed on each of at least the first sheet, the second sheet, or both the first sheet and the second sheet. Further, in some examples, the clip is coupled with the first sheet or the second sheet. The plurality of protrusions is inserted, respectively, into the plurality of holes.

In some examples, a plurality of screw holes is formed on the top side of the chassis and a plurality of through holes corresponding to the plurality of screw holes is formed on the cover. The cover is coupled with the chassis by a plurality of screws passing, respectively, through the plurality of through holes. The plurality of screws is received, respectively, within the plurality of screw holes.

According to certain aspects of the present disclosure, a telecommunication system with a dust-proof frame is disclosed. The dust-proof frame allows airflow to and replacement of a memory. According to various embodiments, the telecommunication system includes a memory module including a memory enclosed by a first sheet, a second sheet, and a clip, the clip being inserted into a gap formed at a top side of the memory module between the first sheet and the second sheet, the first sheet covering a first side of the memory, the second sheet covering a second side of the memory opposite the first side, a first strip coupled to the clip being placed over a portion of the first sheet; and a second strip placed at an opening formed on a top side of the frame. A space is formed between a wall of the opening and the second strip. The memory module is placed within the space formed between the wall of the opening and the second strip. The first strip is located at a first side of the memory module and in contact with the wall. The second strip is in contact with a second side of the memory module. The memory module is replaceably coupled to a printed circuit board (PCB) located within the frame.

In some examples, the telecommunication system further includes a plastic cover placed in the opening to contact the memory module. A latch of a connector included in the memory module is enclosed by the plastic cover. The telecommunication system further includes a metal cover removably coupled to the top side of the frame. The opening is covered by the metal cover. Further, in some examples, the memory module is accessible via the opening when the metal cover is removed from the top side of the frame.

According to certain aspects of the present disclosure, a method for assembling a dust-proof mechanism for a memory in a telecommunication system is disclosed. According to various embodiments, the method includes assembling a memory module by enclosing the memory with a first sheet, a second sheet, and a clip, the clip being inserted into a gap formed at a top side of the memory module between the first sheet and the second sheet. The first sheet covers a first side of the memory, the second sheet covers a second side of the memory opposite the first side, and a first strip coupled to the clip is placed over a portion of the first sheet. The method further includes inserting a second strip into an opening formed on a top side of a frame such that a space is formed between a wall of the opening and the second strip and inserting the assembled memory module into the space formed between the wall of the opening and the second strip. The first strip located at a first side of the memory module contacts the wall and the second strip contacts a second side of the memory module. The memory module is replaceably coupled to a printed circuit board (PCB) located within the frame.

In some examples, the method further includes inserting a plastic cover into the opening and moving the plastic cover to contact the memory module. A latch of a connector included in the memory module is enclosed by the plastic cover. The method further includes coupling a metal cover to the top side of the frame such that the opening is covered by the metal cover. The memory module is accessible via the opening when the metal cover is removed from the top side of the frame.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1A:
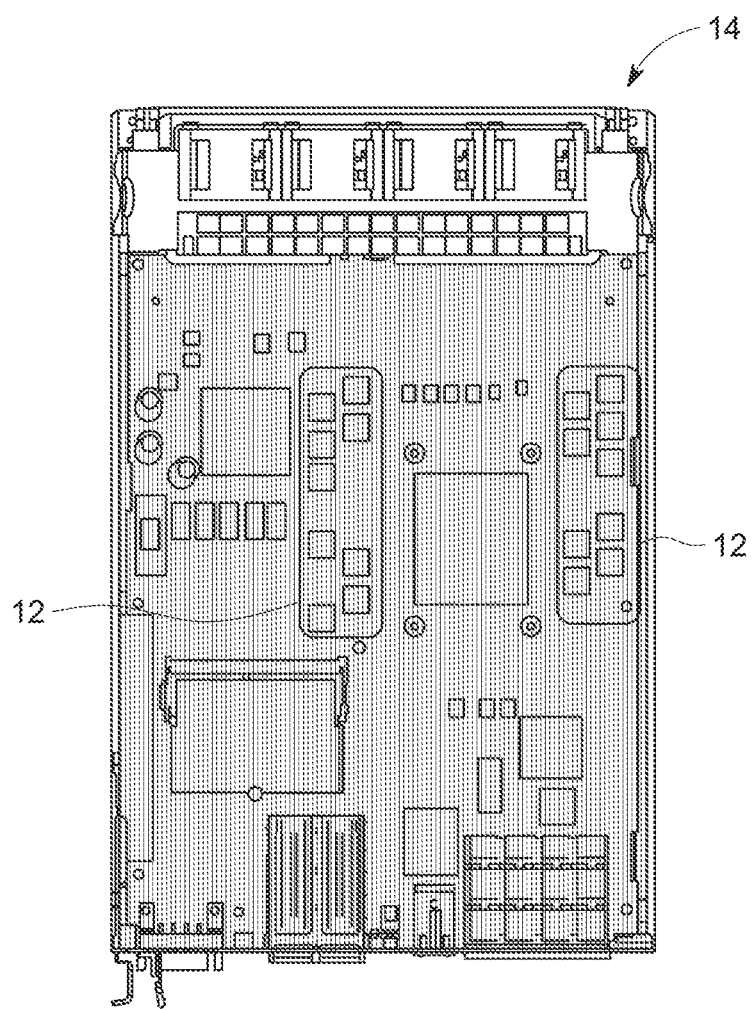
FIG. 1A is a top view of a prior art telecommunication system without being covered by die casting.
Figure 1B:
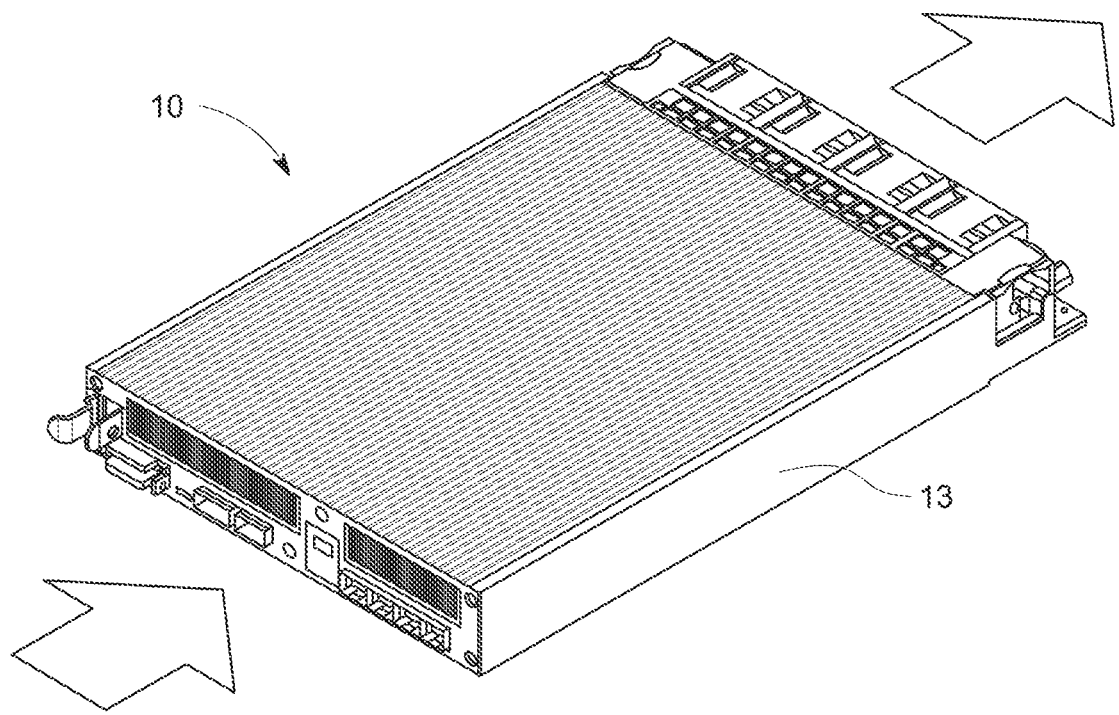
FIG. 1B is a generally perspective view of the prior art telecommunication system shown in FIG. 1A covered by die casting.
Figure 2A:
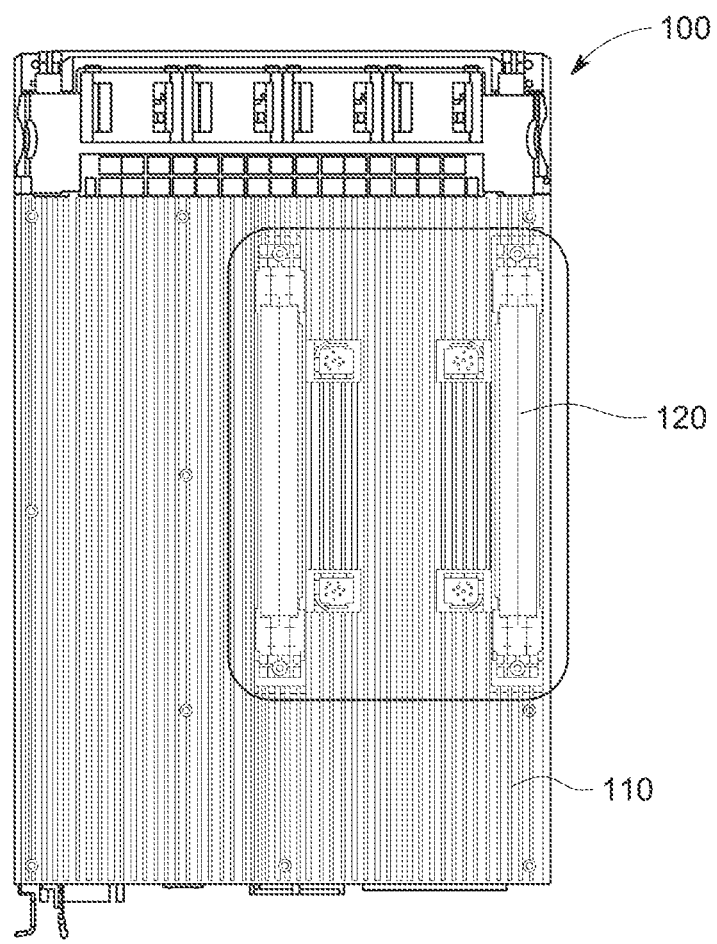
FIG. 2A is a top view of a telecommunication system shown through a protective cover, according to certain aspects of the present disclosure.
Figure 2B:
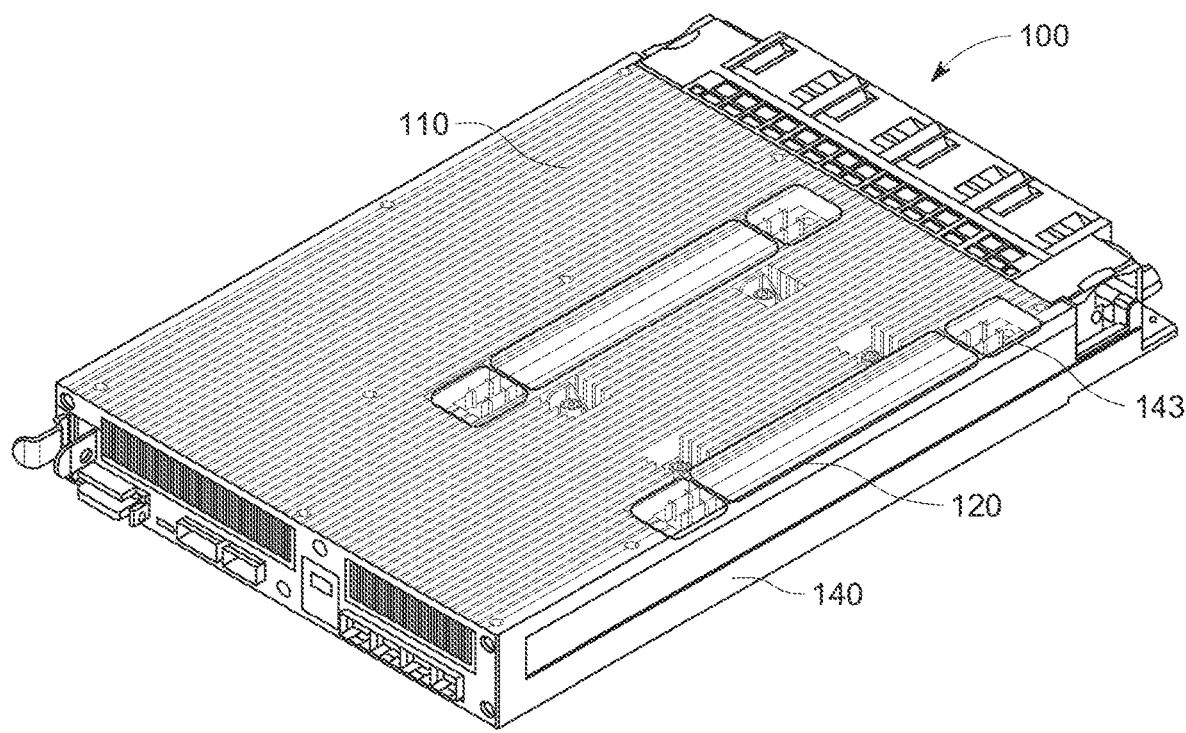
FIG. 2B is a generally perspective view of the telecommunication system shown in FIG. 2A, shown through the protective cover, according to certain aspects of the present disclosure.
Figure 2C:
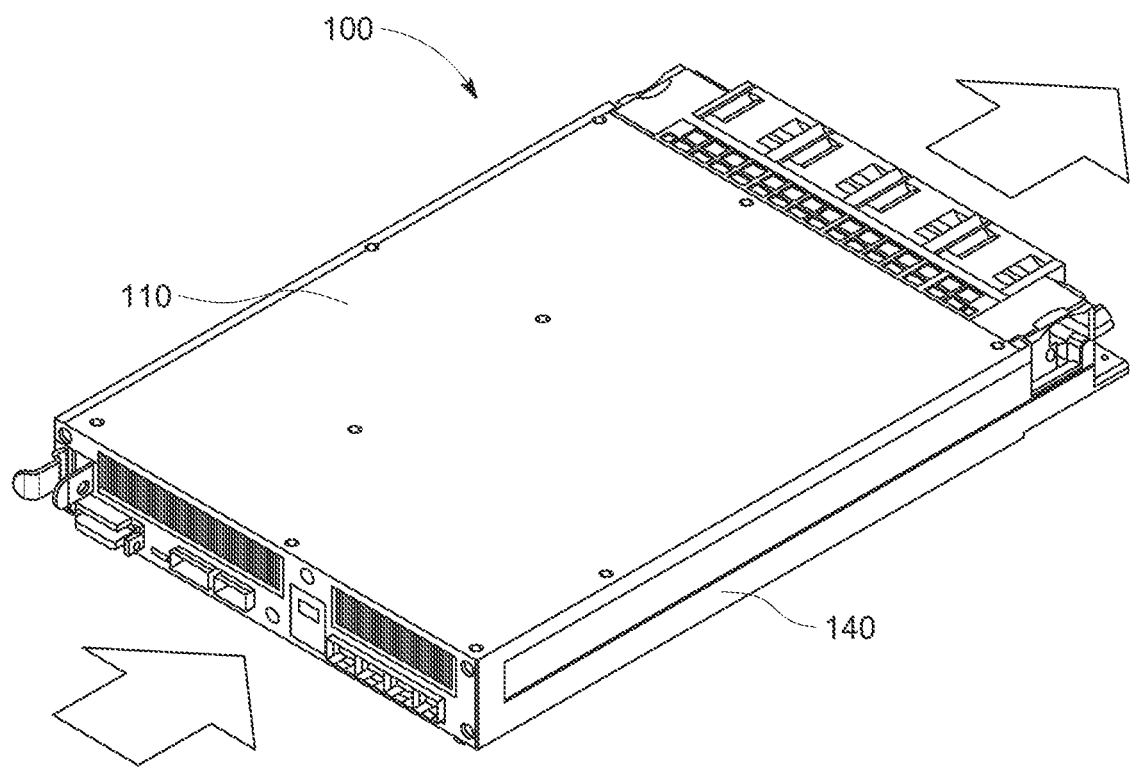
FIG. 2C is a generally perspective view of the telecommunication system shown in FIG. 2B, the protective cover obscuring a dust-proof frame underneath and the direction of airflow being shown, according to certain aspects of the present disclosure.
Figure 2D:
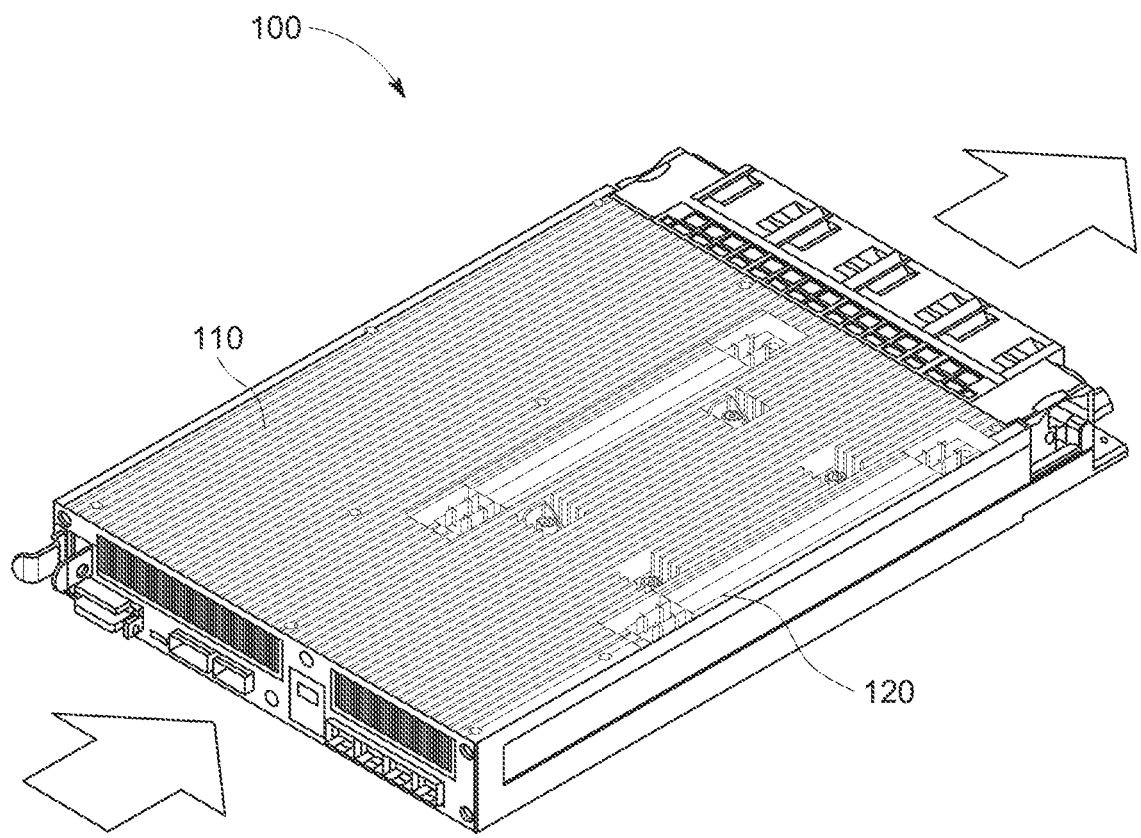
FIG. 2D is a generally perspective view of the telecommunication system shown in FIG. 2B, the dust-proof frame being shown through the protective cover and the direction of airflow being shown, according to certain aspects of the present disclosure.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

The present disclosure relates to telecommunication system or telecommunications frame with a dust-proof mechanism/structure. The dust-proof mechanism/structure allows easy replacement of a memory module, for example DIMM or DIMM module, also allowing airflow to pass through spaces near memory or DIMM modules.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIGS. 2A-2D, a telecommunication system 100 is dust-proof. According to various embodiments, the telecommunication system 100 includes a chassis 140 with a dust-proof mechanism. The dust-proof mechanism of the chassis 140 includes an opening 141 (shown in FIGS. 9 and 10A-10D) formed on a top side thereof. For example, the chassis 140 is die casting. A printed circuit board (PCB) is located within the chassis 140 and a memory module 120 is removably installed on the PCB. The opening 141 is positioned and shaped such that the memory module 120 is accessible via the opening. The telecommunication system 100 further includes a cover 110 removably coupled to the top side of the chassis 140 such that the opening 141 is covered by the cover.

Figure 3:
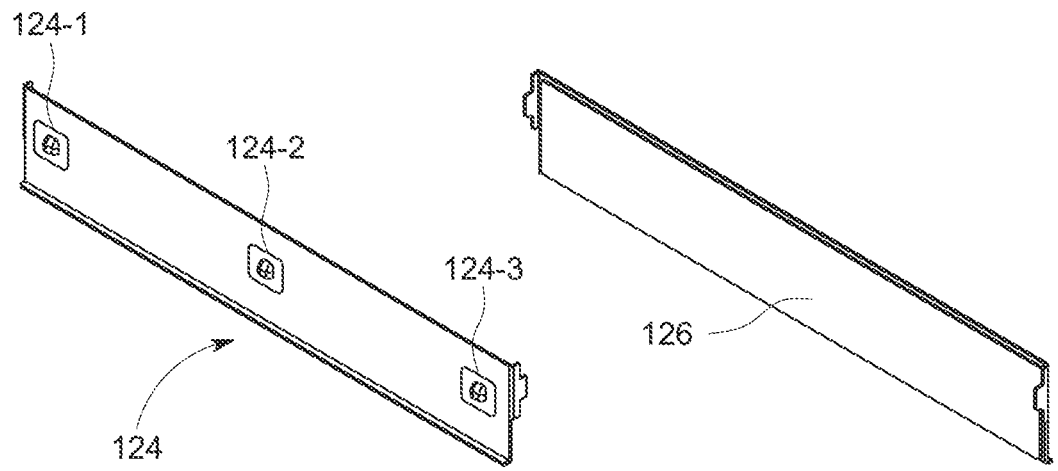
FIG. 3 is a generally perspective view of a first metal sheet and a corresponding thermal pad, according to certain aspects of the present disclosure.
Figure 4:
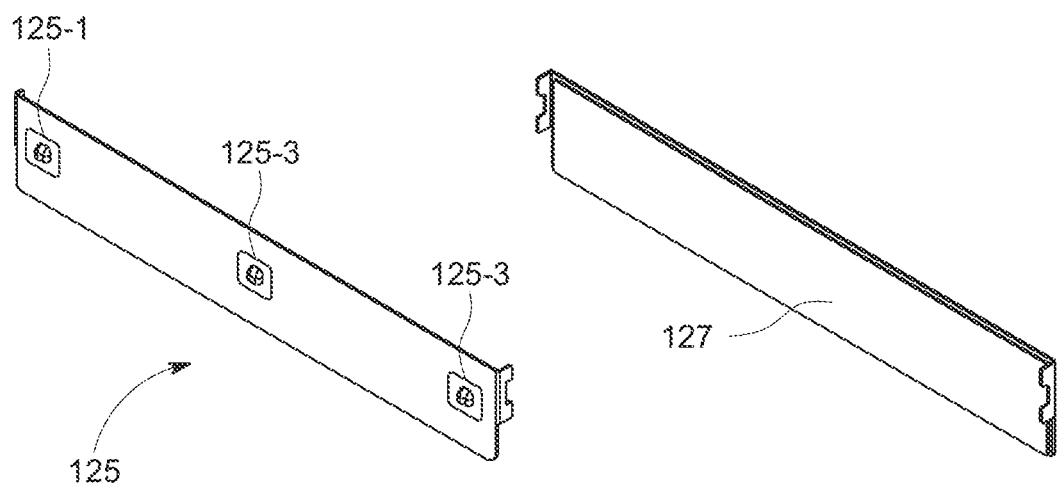
FIG. 4 is a generally perspective view of a second metal sheet and a corresponding thermal pad, according to certain aspects of the present disclosure.
Figure 5A:
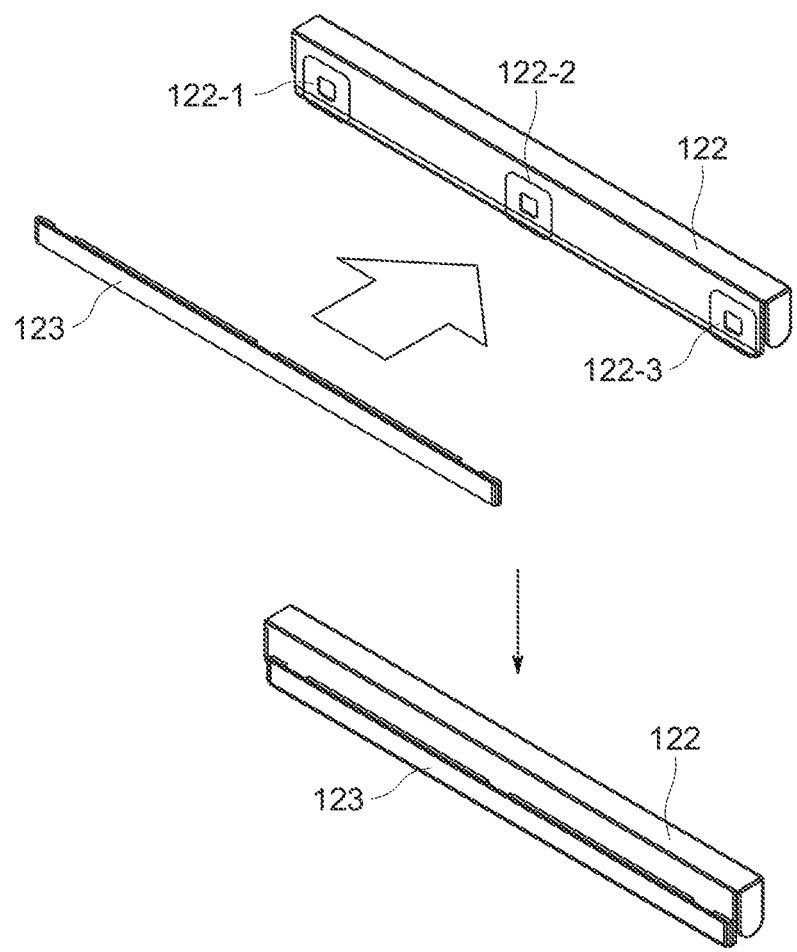
FIG. 5A is a generally perspective view of a metal clip and assembly of the same, according to certain aspects of the present disclosure.
Figure 5B:
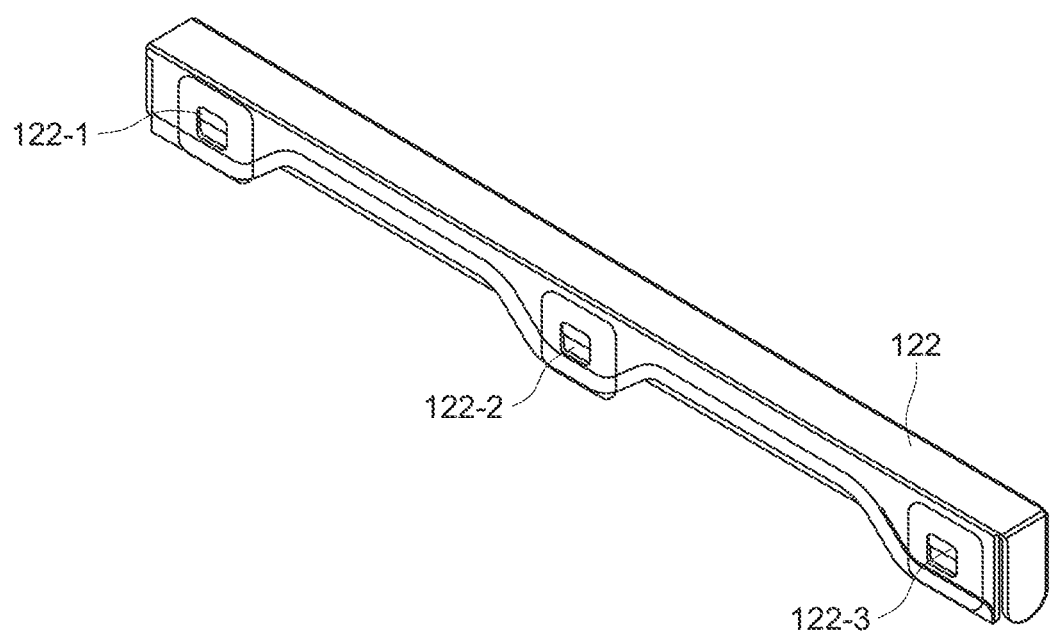
FIG. 5B is a generally perspective view of the metal clip shown in FIG. 5A, an opposite side of the metal clip shown, according to certain aspects of the present disclosure.
Figure 6:
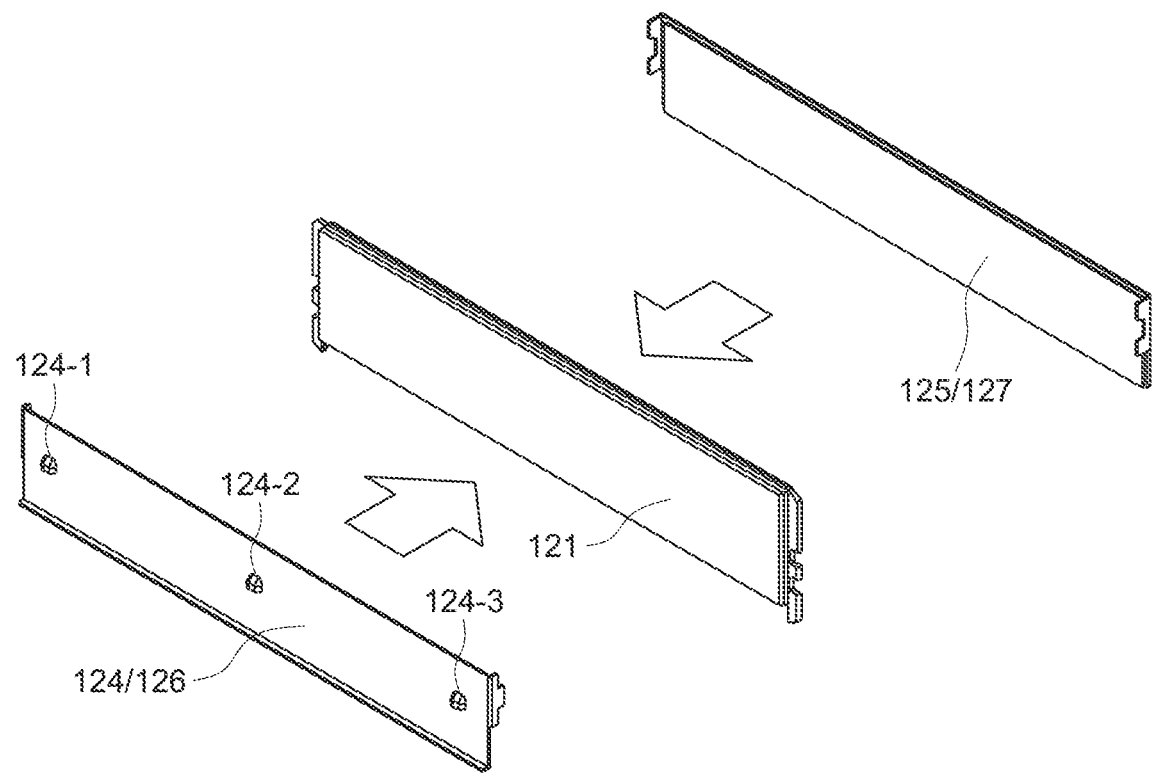
FIG. 6 shows assembly of a DIMM module, according to certain aspects of the present disclosure.
Figure 7B:
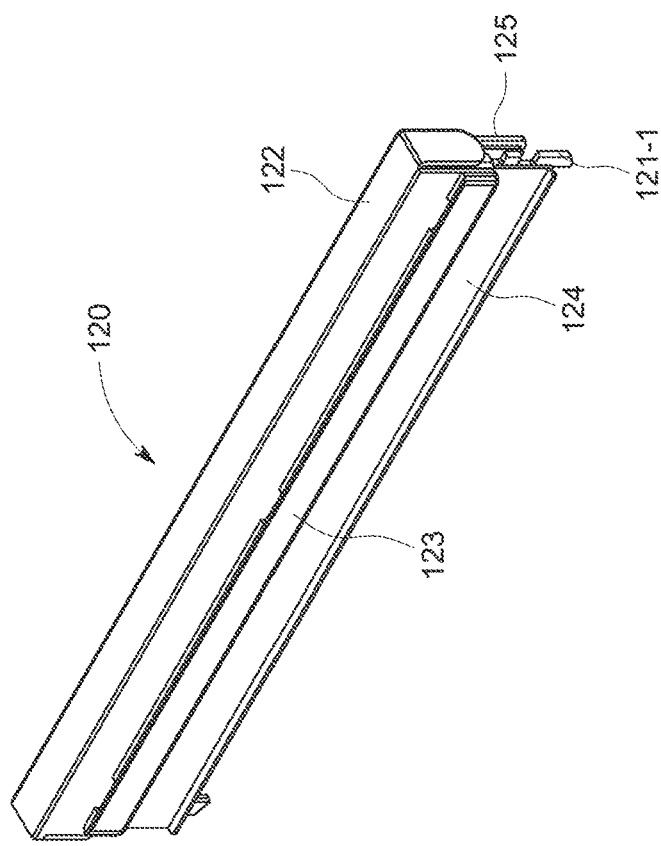
FIG. 7B is a generally perspective view of the DIMM module assembled as shown in FIGS. 6 and 7A, according to certain aspects of the present disclosure.
Figure 7A:
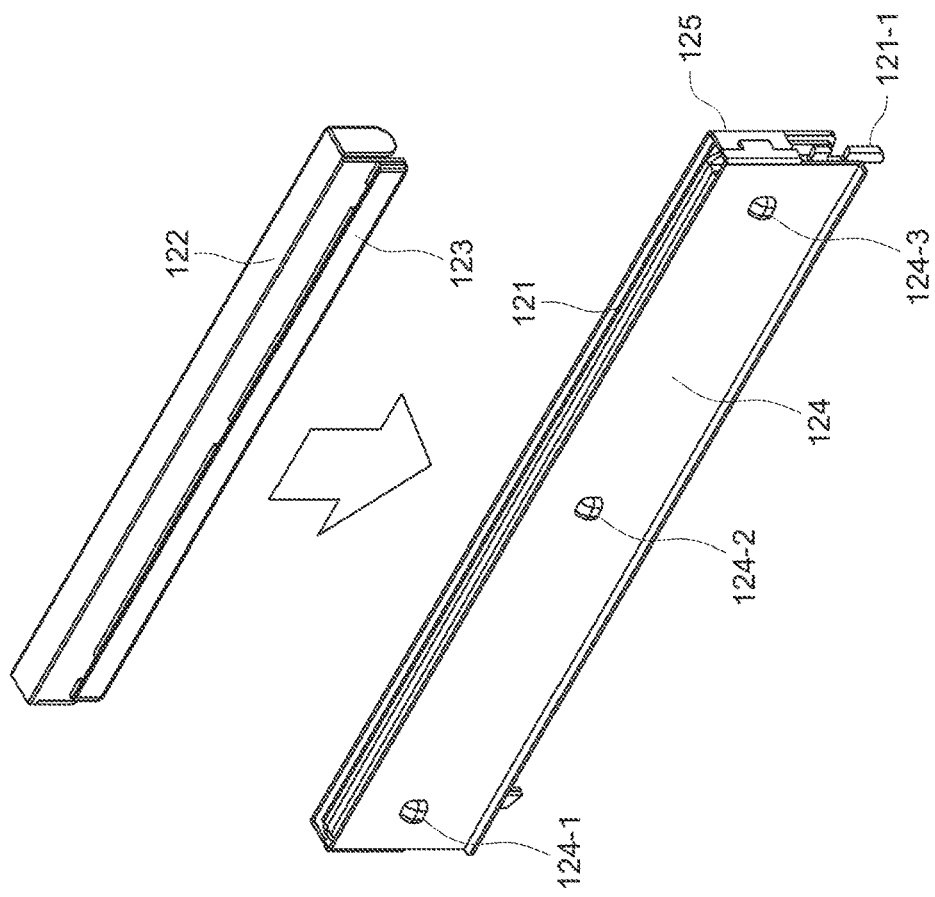
FIG. 7A shows assembly of the DIMM module further to the step shown in FIG. 6, according to certain aspects of the present disclosure.

According to some embodiments, the memory module 120 includes a dual in-line memory module (DIMM) 121. The memory module 120 further includes a first sheet 124 (shown in FIG. 3) covering a first side of the DIMM 121 and a second sheet 125 (shown in FIG. 4) covering a second side of the DIMM opposite the first side. Thus, the DIMM 121 is positioned between the first sheet 124 and the second sheet 125, as shown in FIG. 6. According to some embodiments, each of the first sheet 124 and second sheet 125 includes at least one protrusion 124-1/124-2/124-3 and 125-1/125-2/125-3. Referring to FIGS. 3 and 4, there are thermal pads 126, 127, each respectively corresponding to the first sheet 124 and second sheet 125. The memory module 120 further includes a clip 122 shown in FIGS. 5A and 5B, FIG. 5A showing a first side of the clip and FIG. 5B showing a second side of the clip opposite the first side. The clip 122 is inserted into a gap formed at a top side of the memory module 120 between the first sheet 124 and the second sheet 125, as shown in FIG. 7A.

According to some embodiments, the memory module 120 further includes a first thermal pad 126 coupled to an inner side of the first sheet 124 and a second thermal pad 127 coupled to an inner side of the second sheet 125, as shown in FIGS. 3 and 4. The DIMM 121 is positioned between the first thermal pad 126 and the second thermal pad 127, as shown in FIG. 6.

Figure 8A:
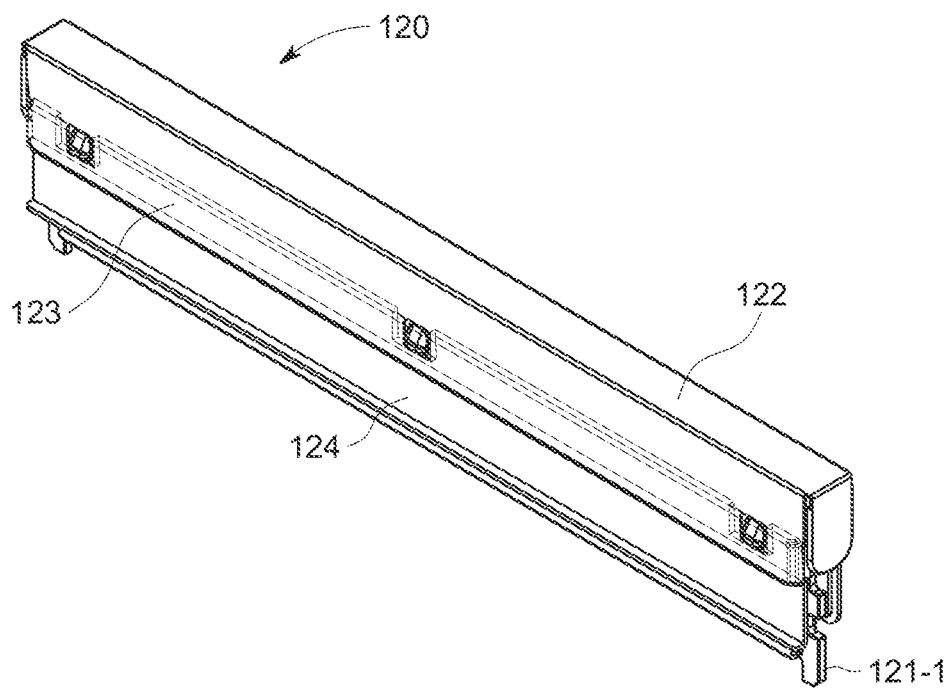
FIG. 8A is a generally perspective view of the assembled DIMM module shown in FIG. 7B, according to certain aspects of the present disclosure.
Figure 8B:
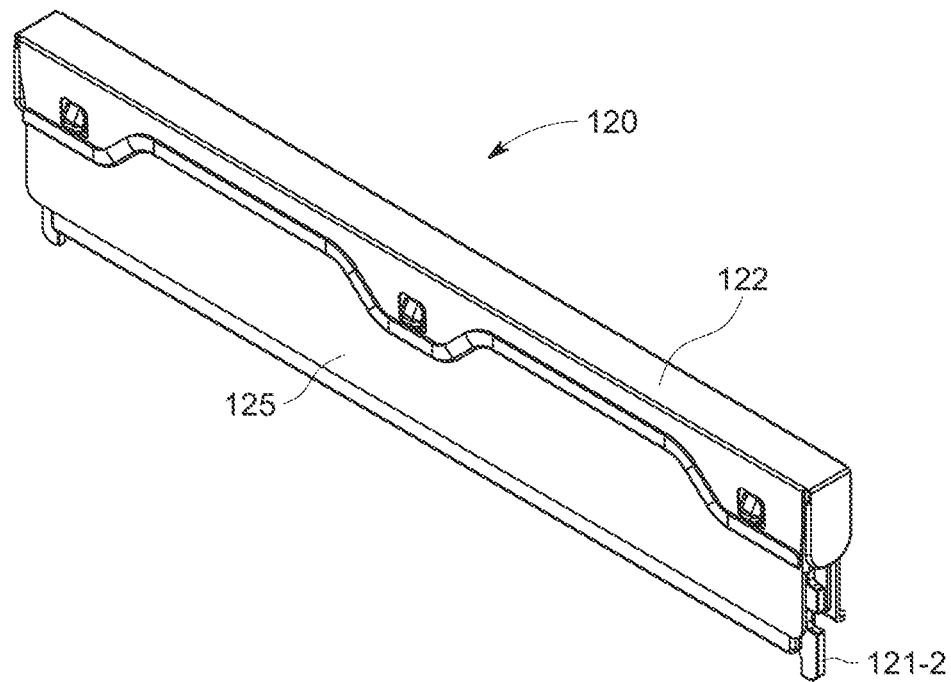
FIG. 8B is a generally perspective view of the assembled DIMM module shown in FIG. 8A, an opposite side of the DIMM module shown, according to certain aspects of the present disclosure.
Figure 9:
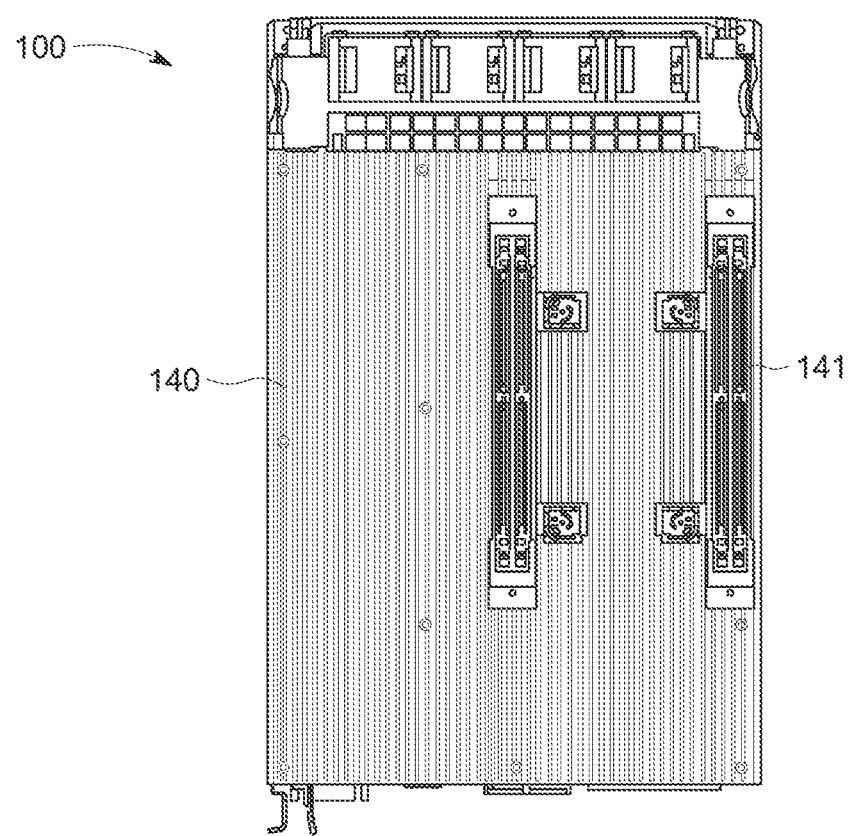
FIG. 9 is a top view of a telecommunication system without a protective cover, according to certain aspects of the present disclosure.
Figure 10A:
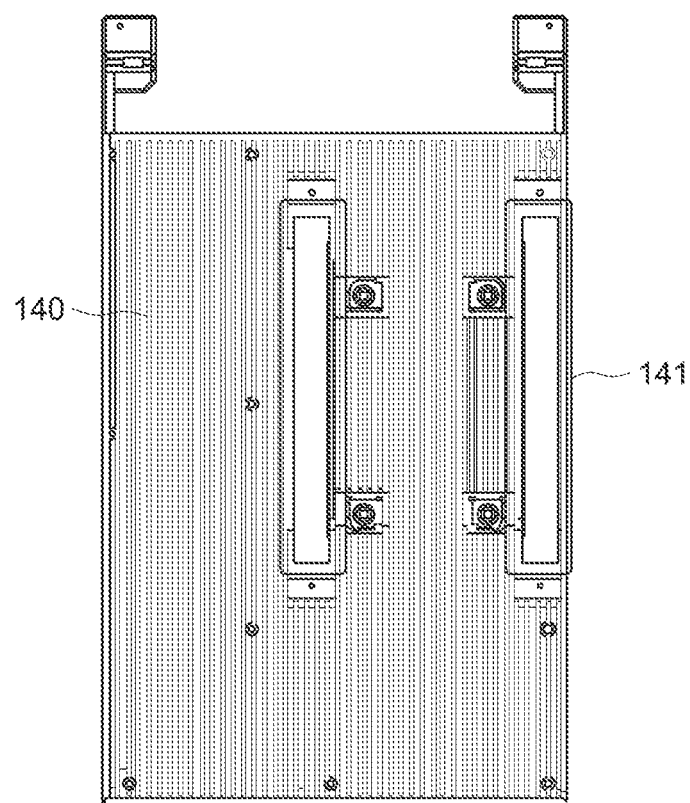
FIG. 10A is a top view of a dust-proof frame of a telecommunication system, according to certain aspects of the present disclosure.
Figure 10B:
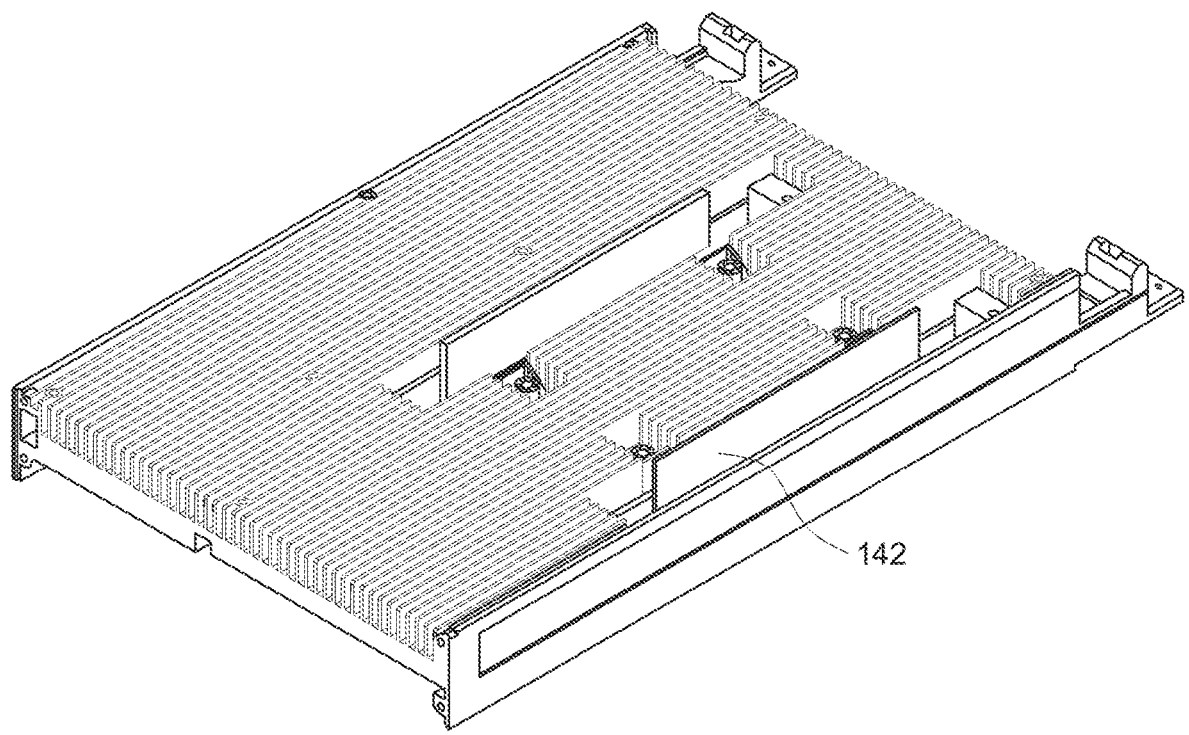
FIG. 10B is a generally perspective view of the dust-proof frame shown in FIG. 10A, according to certain aspects of the present disclosure.
Figure 10C:
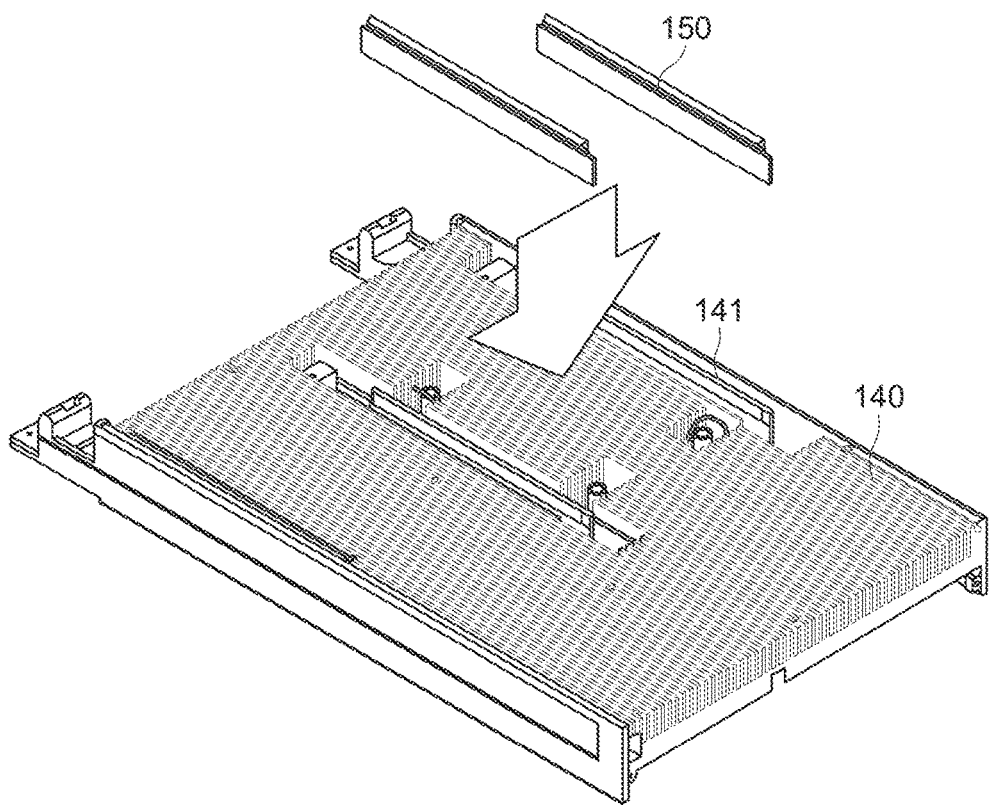
FIG. 10C is a generally perspective view of the dust-proof frame shown in FIGS. 10A and 10B, strips being inserted into respectively corresponding openings of the frame, according to certain aspects of the present disclosure.
Figure 10D:
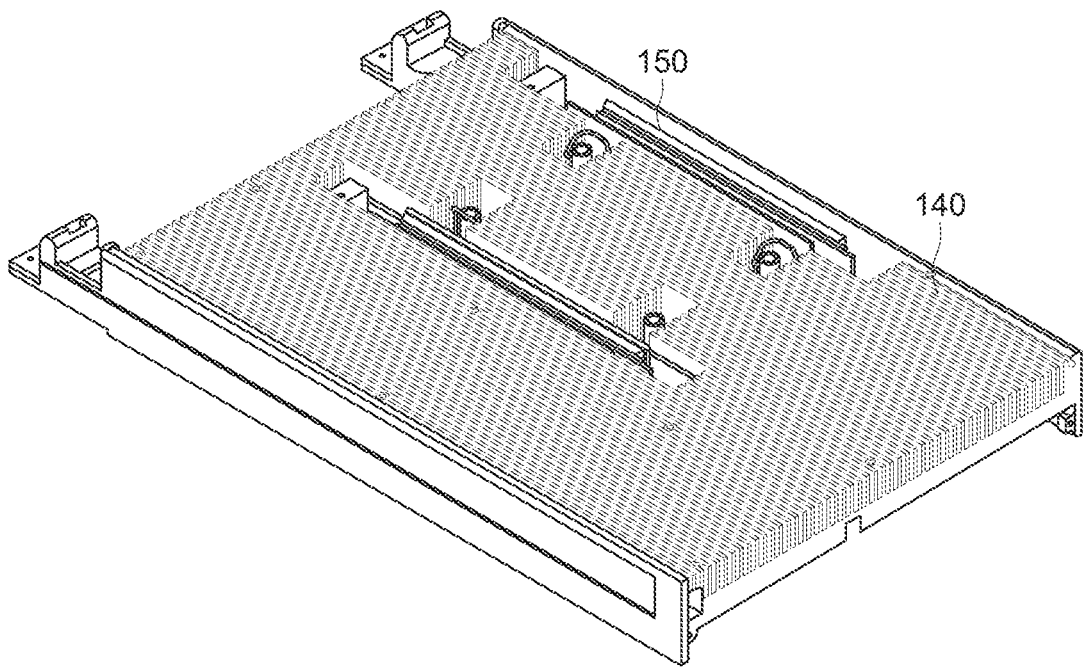
FIG. 10D is a generally perspective view of the dust-proof frame shown in FIG. 10C, with the strips placed in the respectively corresponding openings of the frame, according to certain aspects of the present disclosure.

According to some embodiments, the memory module 120 further includes a first strip 123 coupled to the clip 122, as shown in FIG. 5A. Referring to FIGS. 7A and 7B, the first strip 123 is placed over a portion of the first sheet 124 when the clip 122 with the first strip coupled thereto is inserted into the gap to form the memory module 120. Referring to FIGS. 7A and 7B, a latch 121-1 of a connector of the DIMM 121 is exposed via a side gap of the memory module 120 formed between the first sheet 124 and the second sheet 125. FIG. 8A shows one side of the assembled memory module 120, a latch 121-1 being shown, and FIG. 8B shows the other side of the assembled memory module, a latch 121-2 being shown. Referring to FIG. 10B, the opening 141 of the chassis 140 has a wall 142 and the opening is sized to receive a second strip 150, as shown in FIGS. 10C and 10D.

Figure 11A:
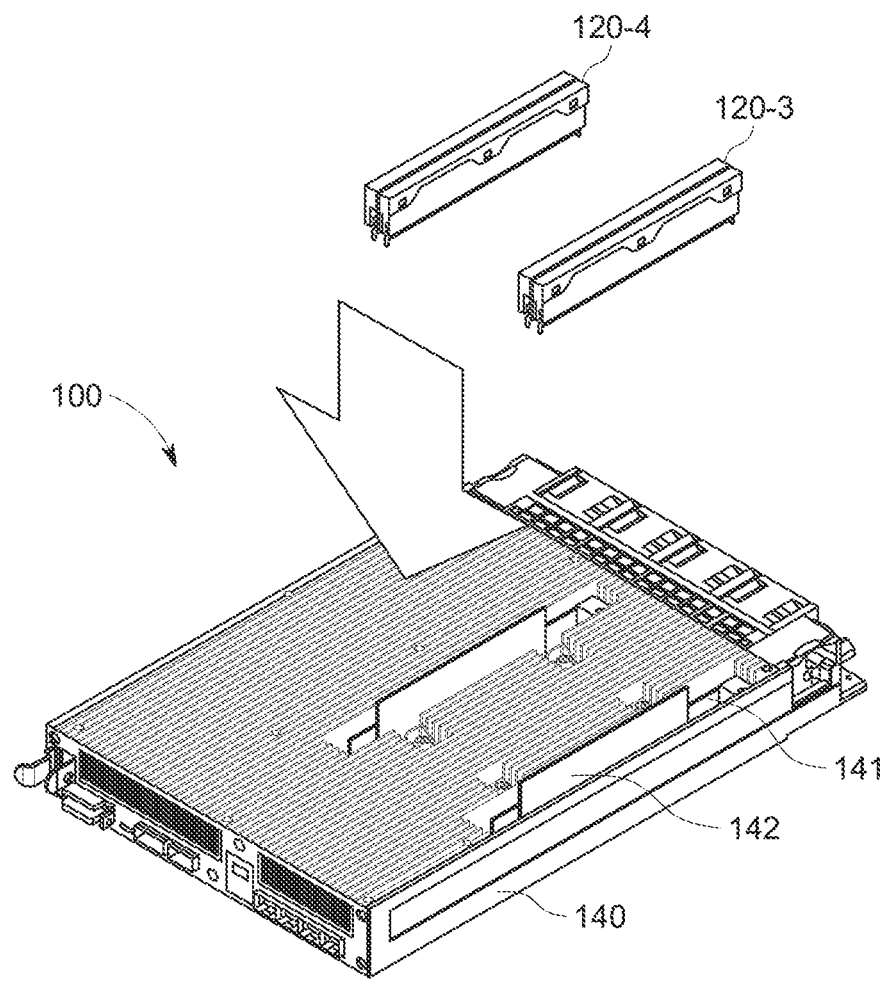
FIG. 11A is a generally perspective view of a telecommunication system without a protective cover, DIMM modules being inserted into respectively corresponding openings of a dust-proof frame, according to certain aspects of the present disclosure.

Referring to FIG. 11A, the opening 141 with the second strip 150 is further sized to receive the memory module 120 (120-3, 120-4). Once the memory module 120 is inserted into the opening 141 with the second strip 150 attached thereto, the first strip 123 located on a first side of the memory module contacts the wall 142 and the second strip contacts a second side of the memory module opposite the first side of the memory module. In FIG. 11A, the second strip 150 positioned opposite the wall 142 in the opening 141 is not shown.

Figure 11B:
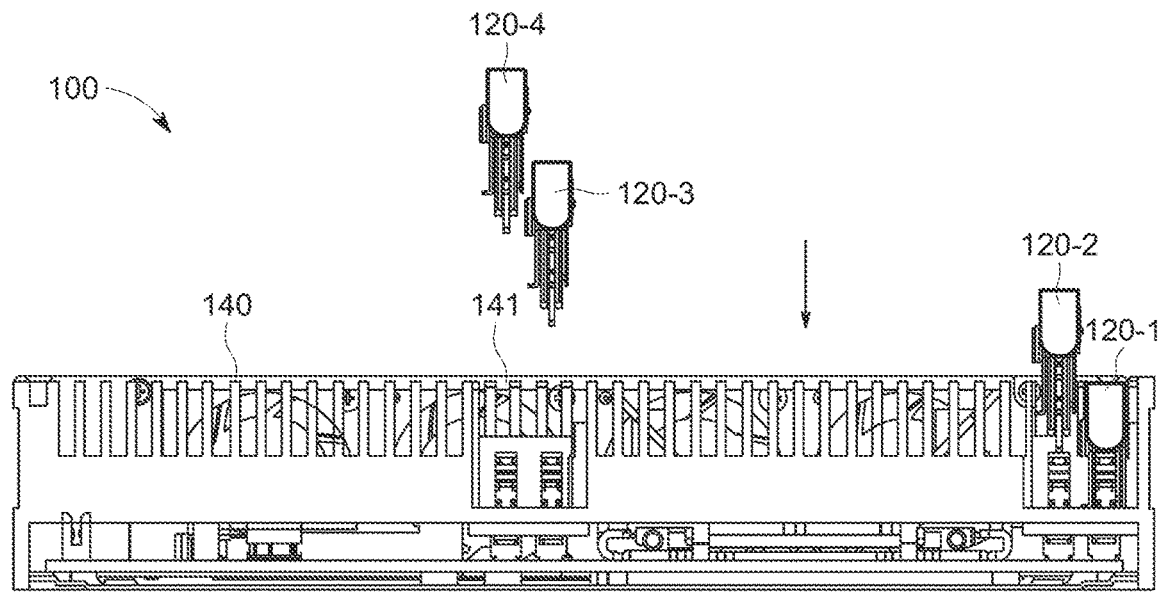
FIG. 11B is a side view of the telecommunication system shown in FIG. 11A, the DIMM installation order shown, according to certain aspects of the present disclosure.
Figure 12A:
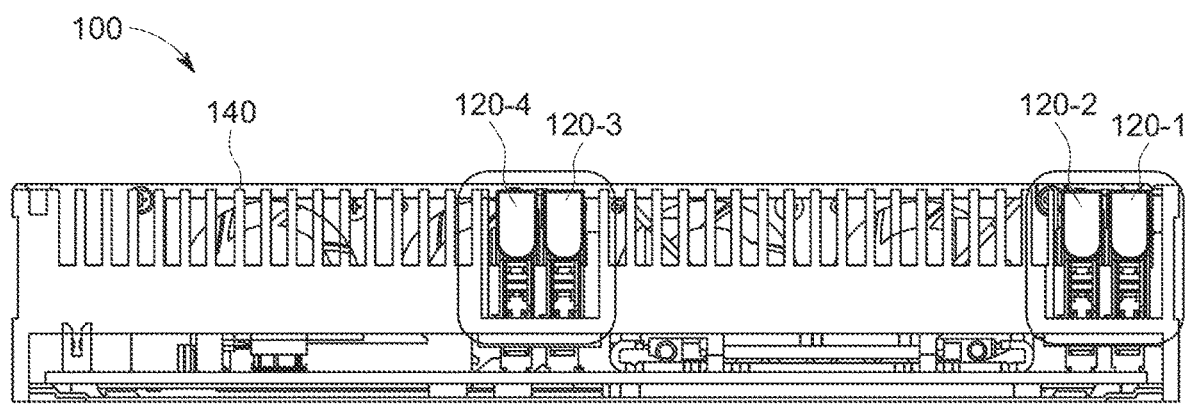
FIG. 12A is a side view of the telecommunication system shown in FIGS. 11A and 11B, with the DIMMs installed in the respectively corresponding openings of the dust-proof frame, according to certain aspects of the present disclosure.
Figure 12B:
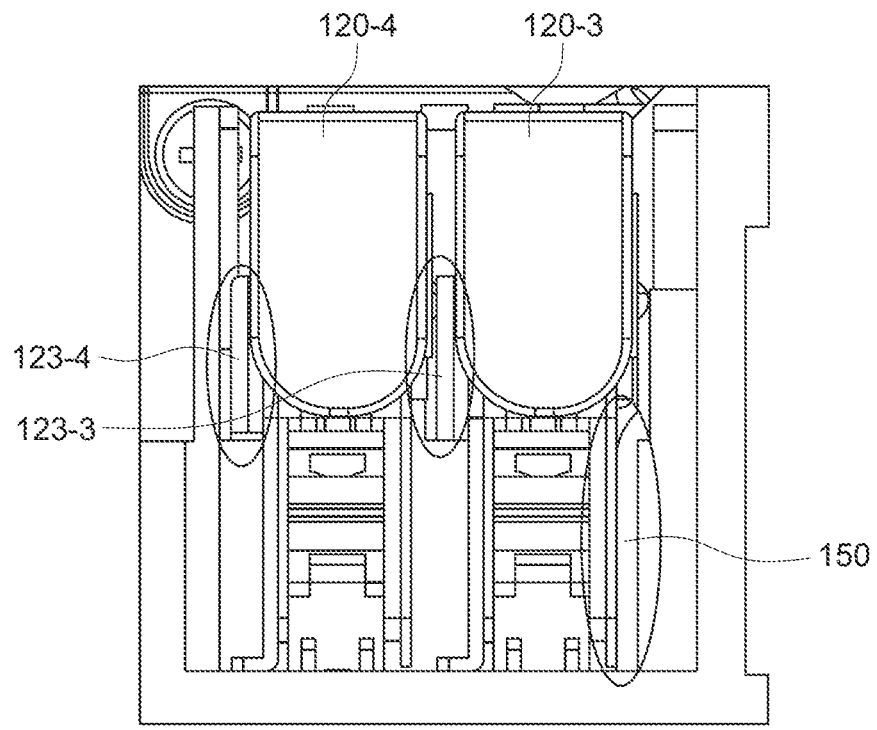
FIG. 12B is a section view of the telecommunication system shown in FIG. 12A, the DIMM modules installed at the corresponding openings of the dust-proof frame, according to certain aspects of the present disclosure.
Figure 13:
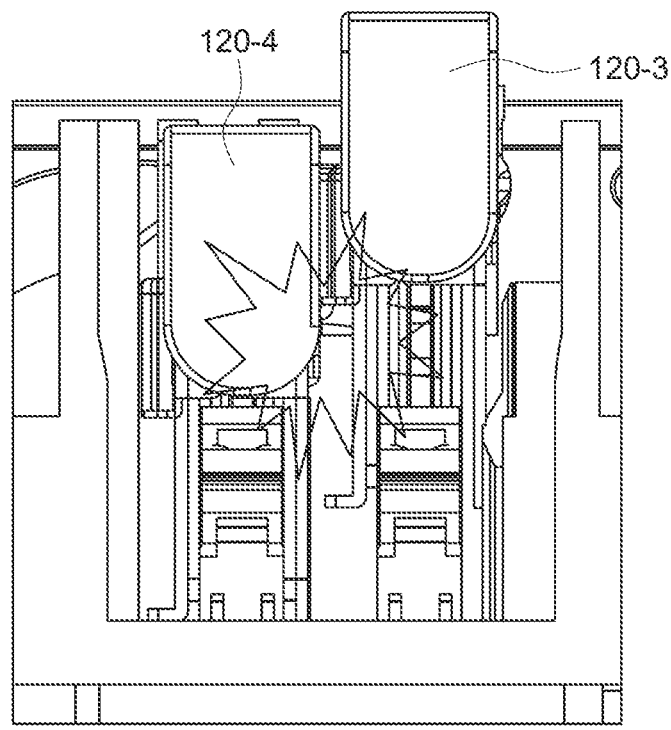
FIG. 13 is a view corresponding to the section view shown in FIG. 12B, showing an exemplary interference caused by an incorrect order of DIMM installation, according to certain aspects of the present disclosure.
Figure 14A:
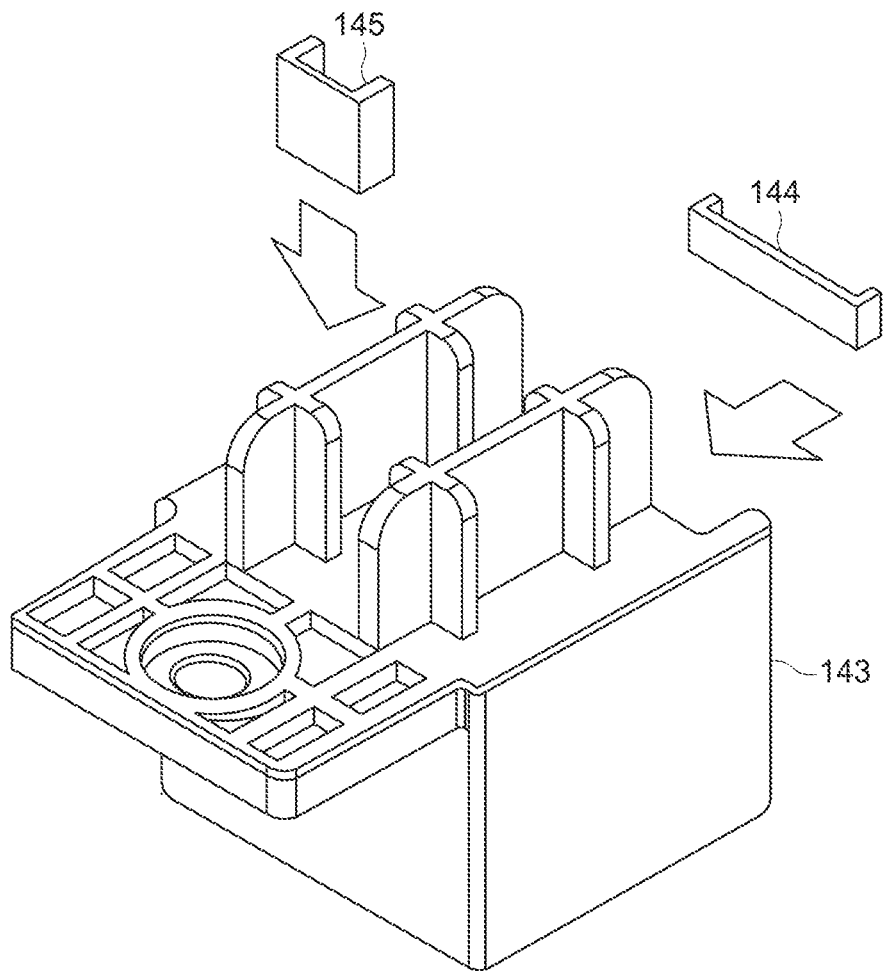
FIG. 14A is a generally perspective view of a cover for a dust-proof frame of a telecommunication system and assembly of the same, according to certain aspects of the present disclosure.
Figure 14B:
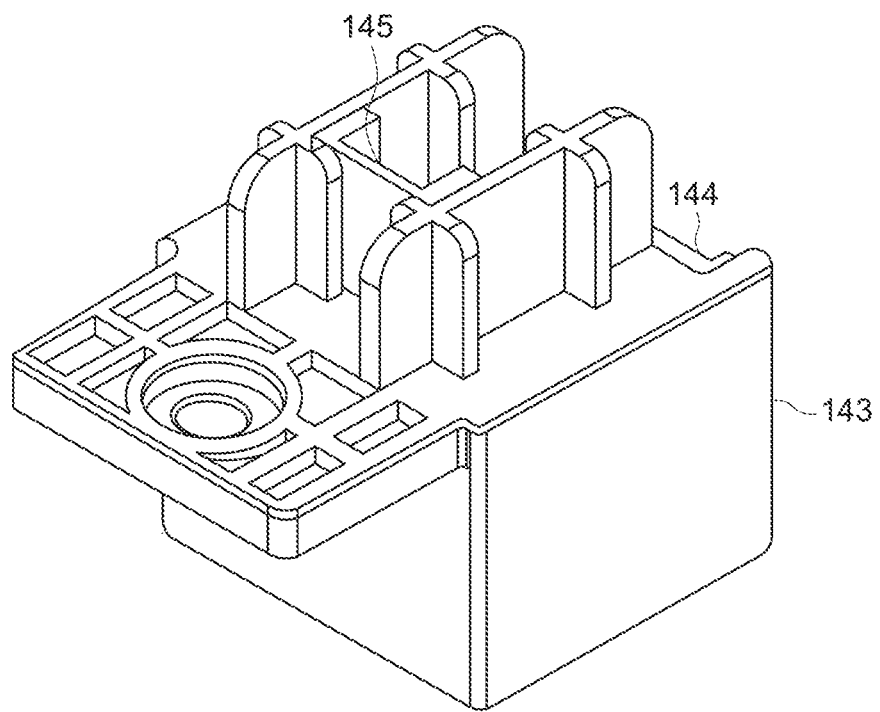
FIG. 14B is a generally perspective view of the cover shown in FIG. 14A, with rubbers/sponges attached thereto, according to certain aspects of the present disclosure.
Figure 14C:
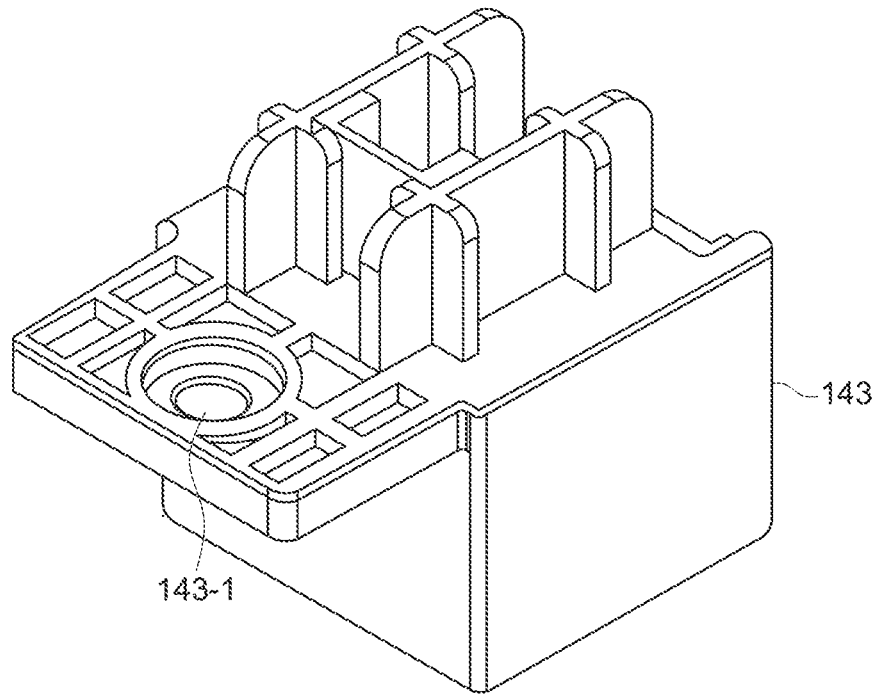
FIG. 14C is a first top perspective view of the cover shown in FIG. 14B, according to certain aspects of the present disclosure.
Figure 14D:
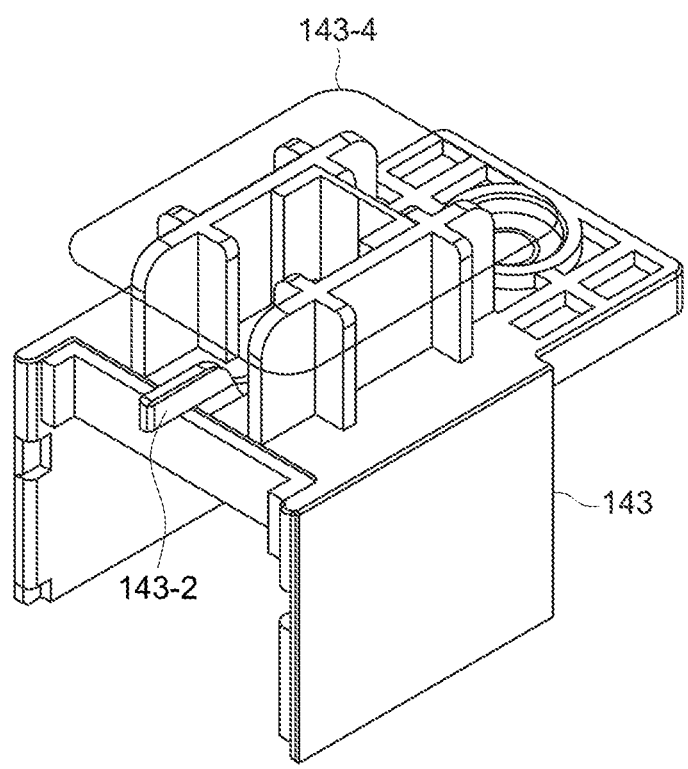
FIG. 14D is a second top perspective view of the cover shown in FIG. 14B, viewed from an opposite direction of a viewing direction in FIG. 14C, according to certain aspects of the present disclosure.
Figure 14E:
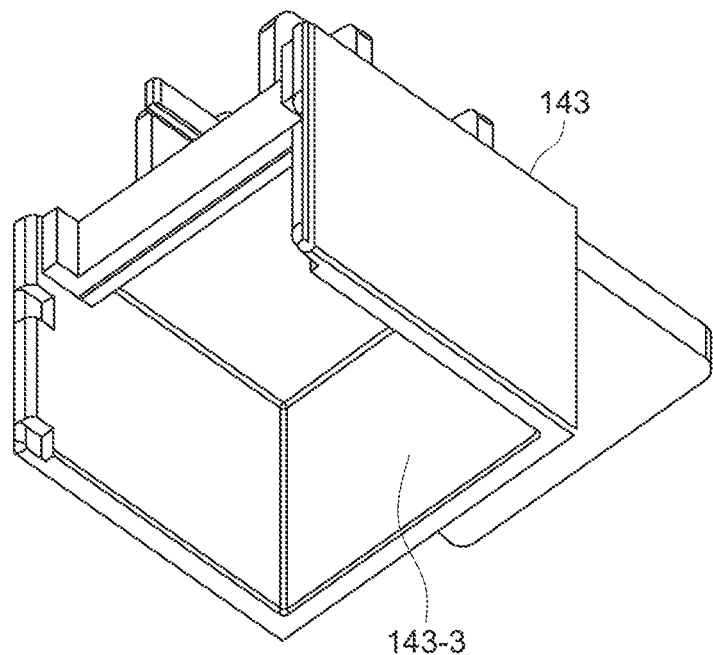
FIG. 14E is a bottom perspective view of the cover shown in FIGS. 14C and 14D, according to certain aspects of the present disclosure.

According to some embodiments, the chassis 140 has more than one opening 141. For example, two openings 141 are shown in FIGS. 9, 10A-10D, and 11A-11B. Referring to FIG. 11A, each opening 141 is sized to receive two memory modules 120-3, 120-4 in addition to the second strip 150. For example, the first memory module 120-3 includes the first strip 123-3 and is in contact with the second strip 150, as shown in FIG. 12B. Referring to FIGS. 12A and 12B, a gap between the first memory module 120-3 and the second memory module 120-4 is blocked by the first strip 123-3. A third strip 123-4 of the second memory module 120-4 is in contact with the wall 142. Referring to FIG. 11B, installing the memory modules 120-1, 120-2, 120-3, 120-4 into the openings 141 of the chassis 140 requires a specific order. For example, one 120-1 or 120-3 of the pairs of memory modules 120-1/120-2 and 120-3/120-4 that contacts the second strip 150 must be inserted into the opening first, and then the other 120-2 or 120-4 can be inserted to contact the respectively corresponding first strip 123 of the pre-inserted memory module 120-1 or 120-3. Moreover, as exemplified in FIG. 11B, the memory modules 120-1, 120-2, 120-3, 120-4 can be assembled in order of 120-1, 120-2, 120-3, and 120-4. If the assembly order is not correct, the assembly may be interfered. For example, as shown in FIG. 13, if the memory module 120-4 contacting the wall 142 is assembled first, and then the memory module 120-3 contacting the second strip 150 is assembled thereafter, there will be interference and it would be impossible or difficult to insert both memory modules 120-3, 120-4 into the opening 141.

However, when the memory modules 120-1, 120-2, 120-3, 120-4 are assembled in the correct order, the gaps between the memory modules are tightly blocked by the first strip 123 attached to the clip 122.

Figure 17A:
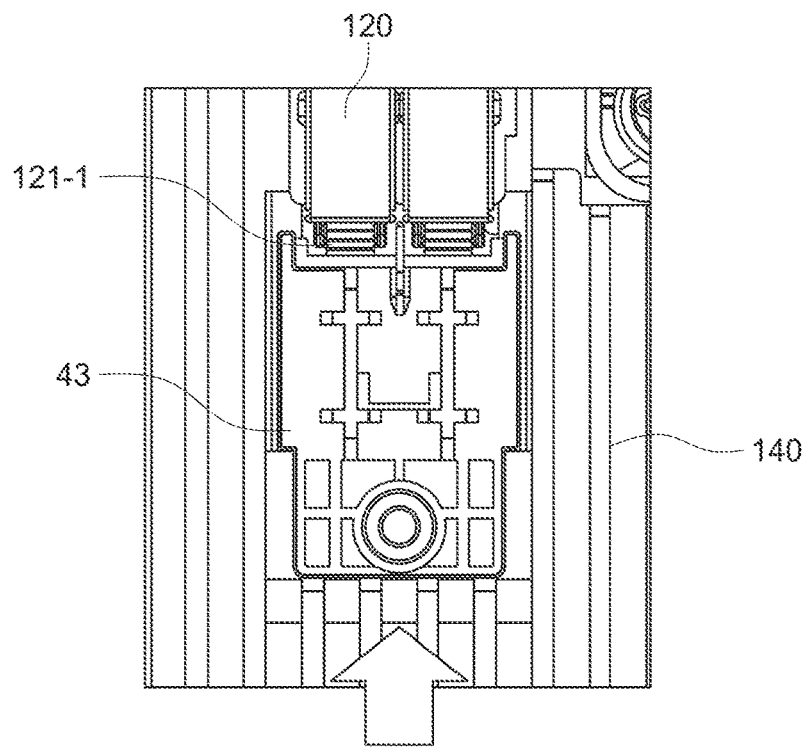
FIG. 17A is a top section view of a dust-proof frame of a telecommunication system with DIMM modules installed at an opening of the frame, a cover inserted into the opening, according to certain aspects of the present disclosure.
Figure 17B:
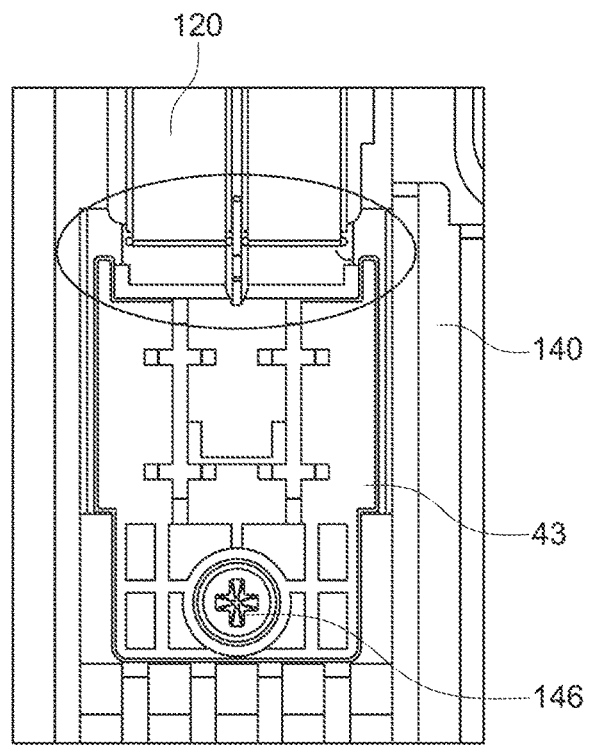
FIG. 17B is a top section view corresponding to the top section shown in FIG. 17A, the cover moved toward the DIMM modules to close a gap between the DIMM modules and the cover, according to certain aspects of the present disclosure.
Figure 18:
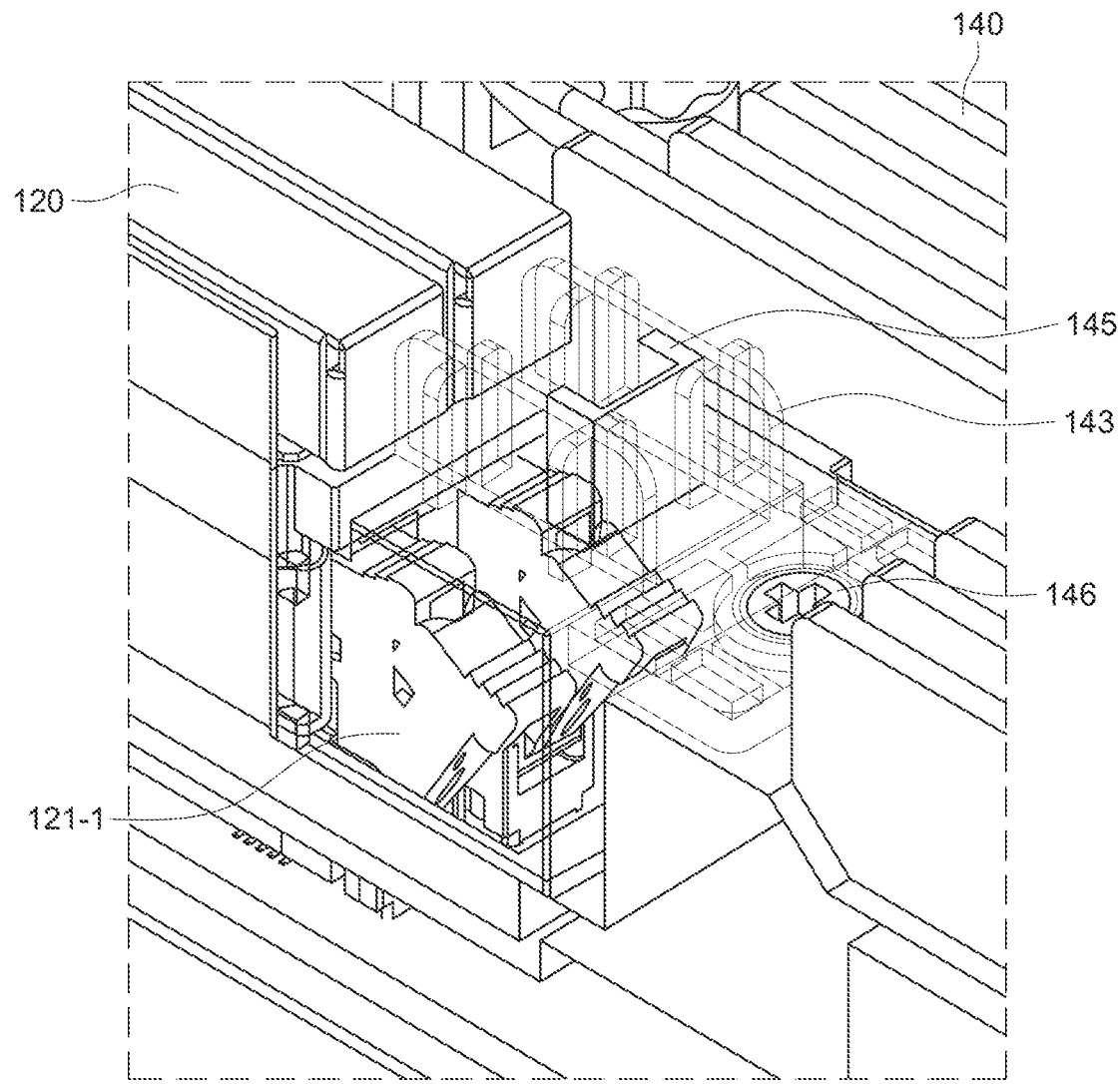
FIG. 18 is a perspective section view of a telecommunication system with DIMM modules and covers installed therein, the cover enclosing a latch of a DIMM connector, according to certain aspects of the present disclosure.

According to some embodiments, the first strip 123-3, the second strip 150, and the third strip 123-4 are made of a rubber material or a sponge material. Furthermore, according to some embodiments, the opening 141 is further sized to receive a cover 143. The cover 143 is shown in FIGS. 14A-14E. For example, the cover 143 is made of a plastic material. As shown in FIGS. 17A, 17B, 18, a structure 143-3 of the cover 143 encloses a first latch 121-1 of a connector that is included in the first memory module 120-3, the cover 143 further enclosing a second latch 121-2 of a connector included in the second memory module 120-4. The cover 143 encloses the first latch 121-1 and the second latch 121-2 when the cover 143 is moved to contact the first and second memory modules 120-3, 120-4, as shown in FIGS. 17A and 17B. Once the cover 143 is in contact with the memory module 120 and the rib structure 143-2 is engaged into the gap formed between the memory modules 120-3, 120-4, a coupler or screw 146 is inserted into a receiving portion 143-1 of the cover 143.

Figure 15:
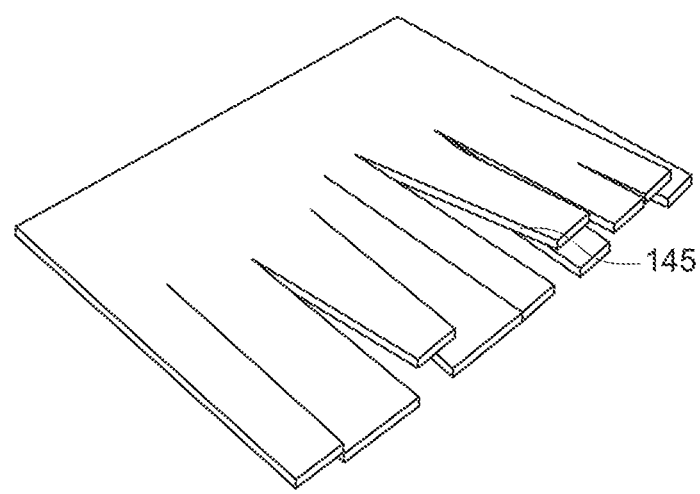
FIG. 15 shows an exemplary rubber included in the cover assembly shown in FIGS. 14C-14E, according to certain aspects of the present disclosure.

In some examples, a first rubber or sponge 144 is coupled to the cover 143 and is in contact with the first and second memory modules 120-3, 120-4. A second rubber or sponge 145 is coupled to the cover 143. In some embodiments, the second rubber or sponge 145 has a plurality of cuts, as exemplified in FIG. 15, such that airflow is allowed through the cuts toward the first and second memory modules 120-3, 120-4. The second rubber or sponge 145 blocks entry of dust to the first and second memory modules 120-3, 120-4 while allowing the airflow to flow through spaces near the memory modules.

Figure 16:
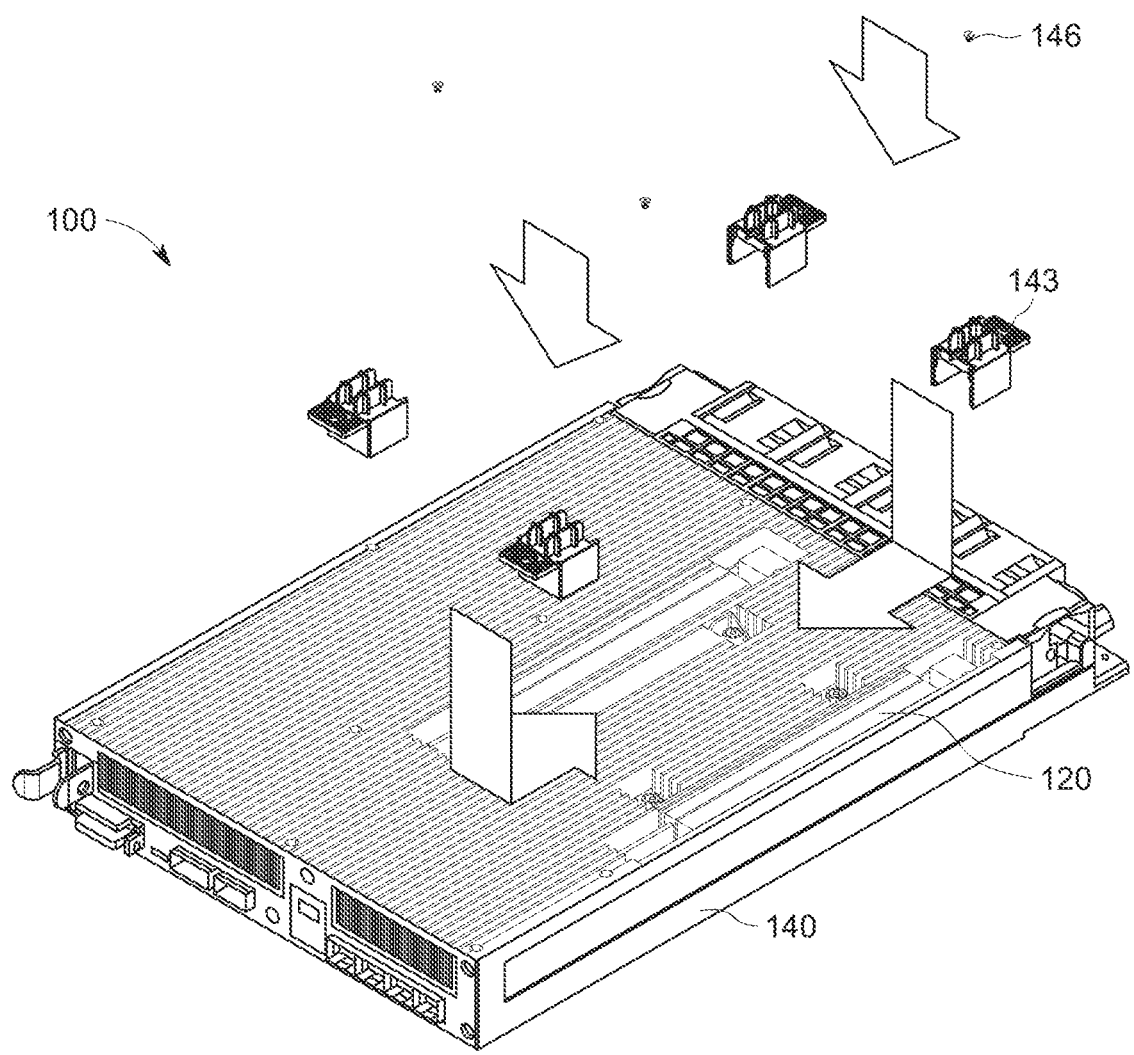
FIG. 16 is a generally perspective view of a telecommunication system without a protective cover, covers being inserted into respectively corresponding openings of a dust-proof frame, according to certain aspects of the present disclosure.

Referring to FIG. 16, the cover 143 with the first rubber or sponge 144 and second rubber or sponge 145 attached thereto is moved from the top to the bottom to be inserted into a gap formed between the memory module 120 and a side of the opening 141, and then the inserted cover 143 is moved toward the memory module. Finally, the coupler or screw 146 is inserted into the receiving portion 143-1 of the cover 143 to fasten the cover 143 onto the chassis 140.

For example, the first sheet 124, the second sheet 125, the clip 122, and the cover 110 are made of a metal material. Further, in some examples, a plurality of holes 122-1, 122-2, 122-3 is formed on the clip 122.

According to some embodiments, a plurality of protrusions 124-1, 124-2, 124-3/125-1, 125-2, 125-3 is formed on each of at least the first sheet 124, the second sheet 125, or both the first sheet and the second sheet. Further, in some examples, the clip 122 is coupled with the first sheet 124 or the second sheet 125. The plurality of protrusions 124-1, 124-2, 124-3/125-1, 125-2, 125-3 is inserted, respectively, into the plurality of holes 122-1, 122-2, 122-3.

Figure 19A:
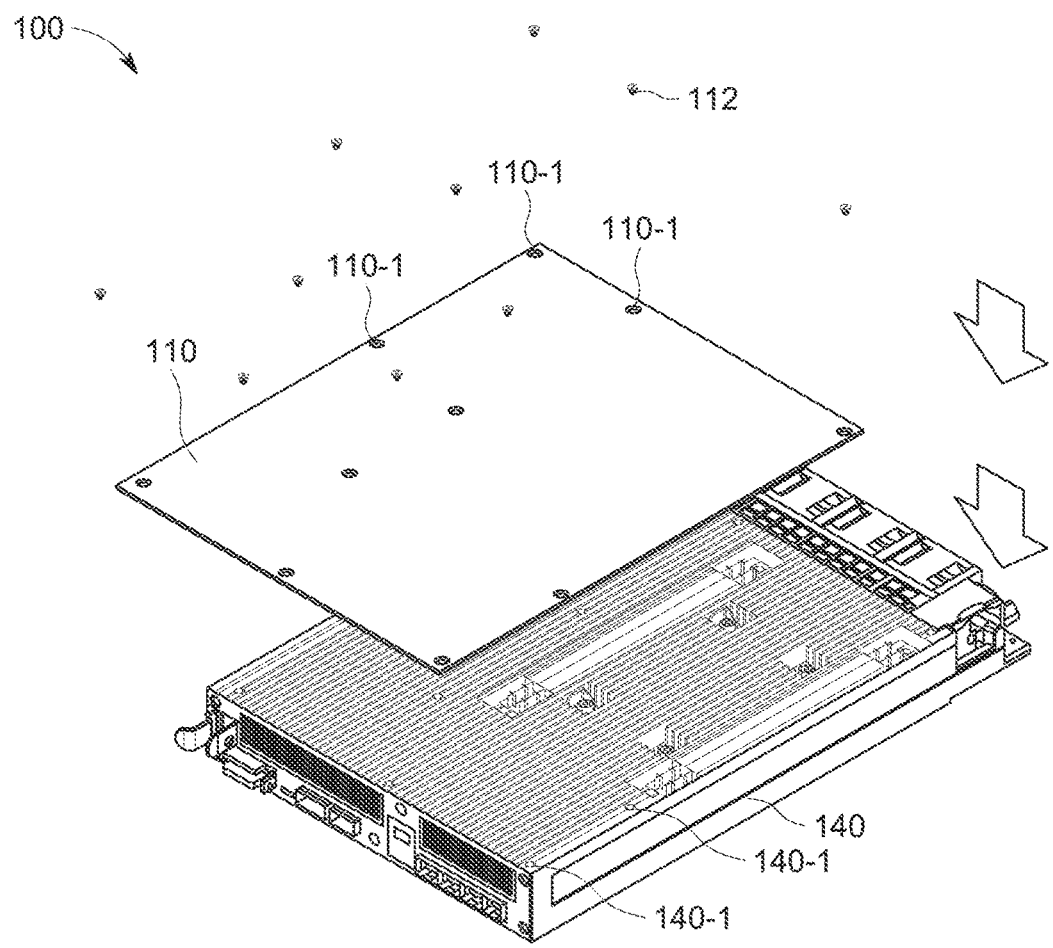
FIG. 19A is a generally perspective view of a telecommunication system, a protective cover being coupled to a dust-proof frame thereof, according to certain aspects of the present disclosure.
Figure 19B:
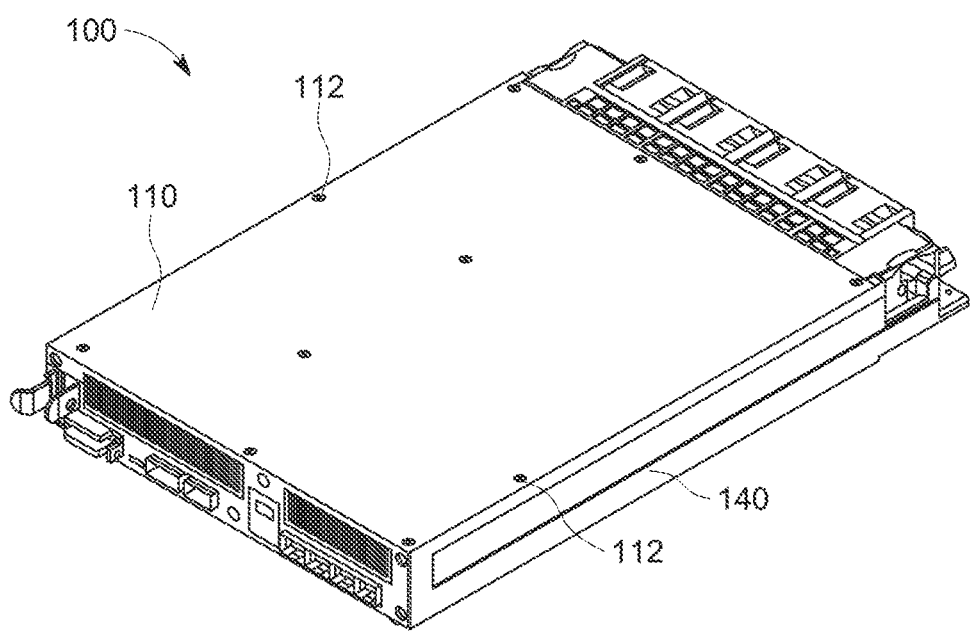
FIG. 19B is a generally perspective view of the telecommunication system shown in FIG. 19A with the protective cover coupled thereto, according to certain aspects of the present disclosure.

According to some embodiments, a plurality of screw holes 140-1 is formed on the top side of the chassis 140 and a plurality of through holes 110-1 corresponding to the plurality of screw holes is formed on the cover 110, as shown in FIG. 19A. The cover 110 is coupled with the chassis 140 by a plurality of screws 112 passing, respectively, through the plurality of through holes 110-1. The plurality of screws 112 is received, respectively, within the plurality of screw holes 140-1, the cover 110 removably coupled to the top side of the chassis 140 to protect the components within the chassis, as shown in FIG. 19B.

Figure 20:
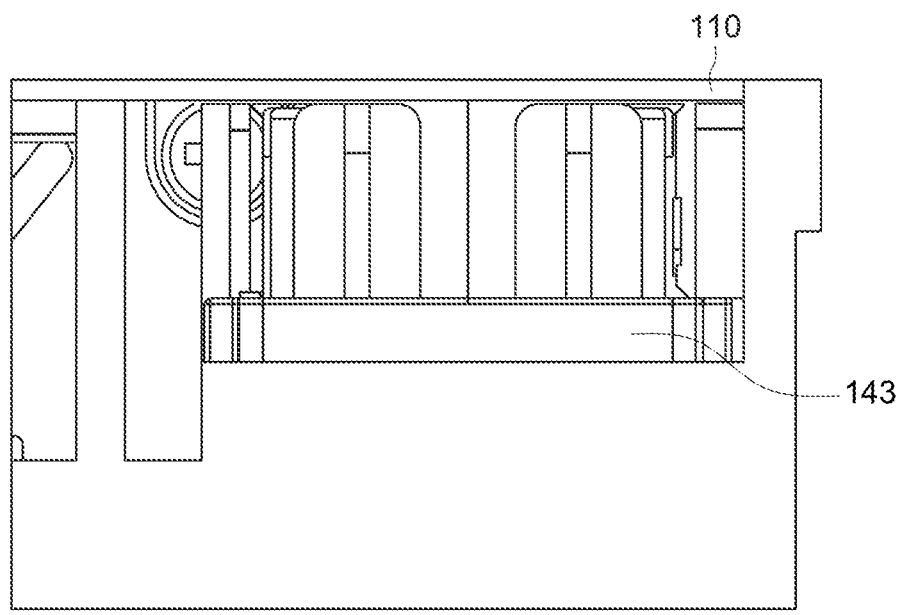
FIG. 20 is a section view of a portion of the telecommunication system shown in FIG. 19B, the protective cover covering the dust-proof frame and a cover installed in an opening of the dust-proof frame, according to certain aspects of the present disclosure.

FIG. 20 shows a section of the internal structure of the telecommunication system 100. The memory modules 120 are stably installed thanks to the cover 143, and the protective cover 110, which can be easily removed, encloses the installed memory modules. When coupled to the top side of the chassis 140, the protective cover 110 is in contact with the cross rib structure 143-4 of the cover 143 and the memory module 120, thus limiting their movement in the height direction, also providing the dust-proof effect.

As discussed above, the telecommunication system 100 with the dust-proof frame/chassis 140 is disclosed. The dust-proof frame/chassis 140 allows airflow to and easy replacement of the memory module 120 that is replaceably coupled to the PCB located within the frame. In particular, the memory module 120 is accessible via the opening 141 when the metal cover 110 is removed from the top side of the frame 140.

In addition to the telecommunication system described above, a method for assembling a dust-proof mechanism for a DIMM 121 in a telecommunication system 100 is disclosed. Referring to FIGS. 5A-7B, the method includes assembling a memory module 120 by enclosing the DIMM 121 with a first sheet 124, a second sheet 125, and a clip 122. In particular, the clip 122 is inserted into a gap formed at a top side of the memory module 120 between the first sheet 124 and the second sheet 125. The first sheet 124 covers a first side of the DIMM 121 and the second sheet 125 covers a second side of the memory opposite the first side. Further, a first strip 123 coupled to the clip 122 is placed over a portion of the first sheet 124. Referring to FIGS. 10C and 10D, the method further includes inserting a second strip 150 into an opening 141 formed on a top side of a frame 140 such that a space is formed between a wall 142 of the opening and the second strip. Referring to FIGS. 11A and 11B, the method further includes inserting the assembled memory module 120 into the space formed between the wall 142 of the opening 141 and the second strip 150. Referring to FIG. 12A, the first strip 123 located at a first side of the memory module 120 contacts the wall 142 and the second strip 150 contacts a second side of the memory module. The memory module 120 is replaceably coupled to a printed circuit board (PCB) located within the frame 140. In the assembly method, when there is a plurality of memory modules 120-1, 120-2, 120-3, 120-4, the assembly order is important to avoid any interference that may be caused by an incorrect assembly order. See FIGS. 11B and 13. For example, as shown in FIG. 11B, memory modules are inserted into the openings 141 in the order of 120-1, 120-2, 120-3, and 120-4 to avoid any interference.

Referring to FIG. 16, the method further includes inserting a cover 143 into the opening 141 and moving the plastic cover to contact the memory module 120. A latch 121-1 of a connector included in the memory module 120 is enclosed by the cover 143, as shown in FIGS. 17A, 17B, and 18. Referring to FIGS. 19A and 19B, the method further includes coupling a metal cover 110 to the top side of the frame 140 such that the opening 141 is covered by the metal cover. The memory module 120 is accessible via the opening 141 when the metal cover 110 is removed from the top side of the frame 140.

While various embodiments of the present disclosure have been described above, it should be understood that they have been presented by way of example only, and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

One or more elements or aspects or steps, or any portion(s) thereof, from one or more of any of claims below can be combined with one or more elements or aspects or steps, or any portion(s) thereof, from one or more of any of the other claims or combinations thereof, to form one or more additional implementations and/or claims of the present disclosure.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A telecommunication system comprising:
   a chassis comprising an opening on a top side thereof;
   a printed circuit board (PCB) located within the chassis;
   a memory module removably installed on the PCB, wherein the opening is positioned and shaped such that the memory module is accessible via the opening; and
   a cover removably coupled to the top side of the chassis such that the opening is covered by the cover, wherein the memory module comprises:
   a dual in-line memory module (DIMM);
   a first sheet covering a first side of the DIMM;
   a second sheet covering a second side of the DIMM opposite the first side such that the DIMM is positioned between the first sheet and the second sheet;
   a clip inserted into a gap formed at a top side of the memory module between the first sheet and the second sheet; and
   a first strip coupled to the clip such that the first strip is placed over a portion of the first sheet when the clip is inserted into the gap to form the memory module.

2. The telecommunication system of claim 1, wherein the memory module further comprises:
   a first thermal pad coupled to an inner side of the first sheet; and
   a second thermal pad coupled to an inner side of the second sheet such that the DIMM is positioned between the first thermal pad and the second thermal pad.

3. The telecommunication system of claim 1, wherein a latch of a connector of the DIMM is exposed via a side gap of the memory module formed between the first sheet and the second sheet.

4. The telecommunication system of claim 1, wherein the opening has a wall and is sized to receive a second strip.

5. The telecommunication system of claim 4, wherein the opening is further sized to receive the memory module such that the first strip located on a first side of the memory module contacts the wall and the second strip contacts a second side of the memory module opposite the first side of the memory module.

6. The telecommunication system of claim 4, wherein the opening is further sized to receive another memory module in addition to the second strip, the memory module being a first memory module and the another memory module being a second memory module, the first memory module including the first strip and being in contact with the second strip, a gap between the first memory module and the second memory module being blocked by the first strip, a third strip of the second memory module being in contact with the wall.

7. The telecommunication system of claim 6, wherein the first strip, the second strip, and the third strip are made of a rubber material or a sponge material.

8. The telecommunication system of claim 6, wherein the opening is further sized to receive a plastic cover, the plastic cover enclosing a first latch of a connector that is included in the memory module, the plastic cover further enclosing a second latch of a connector included in the second memory module, the plastic cover enclosing the first latch and the second latch when the plastic cover is moved to contact the first and second memory modules.

9. The telecommunication system of claim 8, wherein: a first rubber or sponge is coupled to the plastic cover and is in contact with the first and second memory modules; and
   a second rubber or sponge is coupled to the plastic cover and has a plurality of cuts such that airflow is allowed through the cuts toward the first and second memory modules, the second rubber or sponge blocking entry of dust to the first and second memory modules.

10. The telecommunication system of claim 1, wherein the first sheet, the second sheet, the clip, and the cover are made of a metal material.

11. The telecommunication system of claim 1, wherein a plurality of holes is formed on the clip.

12. The telecommunication system of claim 11, wherein a plurality of protrusions is formed on each of at least the first sheet, the second sheet, or both the first sheet and the second sheet.

13. The telecommunication system of claim 12, wherein the clip is coupled with the first sheet or the second sheet, the plurality of protrusions being inserted, respectively, into the plurality of holes.

14. The telecommunication system of claim 1, wherein a plurality of screw holes is formed on the top side of the chassis and a plurality of through holes corresponding to the plurality of screw holes is formed on the cover, the cover being coupled with the chassis by a plurality of screws passing, respectively, through the plurality of through holes, the plurality of screws being received, respectively, within the plurality of screw holes.

15. A telecommunication system with a dust-proof frame for allowing airflow and replacement of a memory, the telecommunication system comprising:
   a memory module including a memory enclosed by a first sheet, a second sheet, and a clip, the clip being inserted into a gap formed at a top side of the memory module between the first sheet and the second sheet, the first sheet covering a first side of the memory, the second sheet covering a second side of the memory opposite the first side, a first strip coupled to the clip being placed over a portion of the first sheet; and a second strip placed at an opening formed on a top side of the frame such that a space is formed between a wall of the opening and the second strip, wherein the memory module is placed within the space formed between the wall of the opening and the second strip, the first strip being located at a first side of the memory module and in contact with the wall, the second strip being in contact with a second side of the memory module, the memory module being replaceably coupled to a printed circuit board (PCB) located within the frame.

16. The telecommunication system of claim 15, further comprising:

a plastic cover placed in the opening to contact the memory module such that a latch of a connector included in the memory module is enclosed by the plastic cover; and a metal cover removably coupled to the top side of the frame such that the opening is covered by the metal cover, wherein the memory module is accessible via the opening when the metal cover is removed from the top side of the frame.

17. A method for assembling a dust-proof mechanism for a memory in a telecommunication system, the method comprising:

assembling a memory module by enclosing the memory with a first sheet, a second sheet, and a clip, the clip being inserted into a gap formed at a top side of the memory module between the first sheet and the second sheet, wherein the first sheet covers a first side of the memory, the second sheet covers a second side of the memory opposite the first side, and a first strip coupled to the clip is placed over a portion of the first sheet;

inserting a second strip into an opening formed on a top side of a frame such that a space is formed between a wall of the opening and the second strip; and inserting the assembled memory module into the space formed between the wall of the opening and the second strip such that the first strip located at a first side of the memory module contacts the wall and the second strip contacts a second side of the memory module, the memory module being replaceably coupled to a printed circuit board (PCB) located within the frame.

18. The method of claim 17, further comprising:

inserting a plastic cover into the opening and moving the plastic cover to contact the memory module such that a latch of a connector included in the memory module is enclosed by the plastic cover; and coupling a metal cover to the top side of the frame such that the opening is covered by the metal cover, wherein the memory module is accessible via the opening when the metal cover is removed from the top side of the frame.

19. A telecommunication system comprising:

a chassis comprising a top side, at least two separate openings formed on the top side;

a printed circuit board (PCB) located within the chassis, the PCB being covered by the top side of the chassis;

a memory module removably installed on the PCB, wherein each of the at least two openings is positioned and shaped such that the memory module is accessible via the opening; and a cover removably coupled to the top side of the chassis such that the opening and the top side of the chassis are covered by the cover when the cover is coupled to the top side of the chassis, wherein a plurality of screw holes is formed on the top side of the chassis and a plurality of through holes corresponding to the plurality of screw holes is formed on the cover such that the cover is coupled with the chassis by a plurality of screws passing, respectively, through the plurality of through holes.

20. The telecommunication system of claim 19, wherein the memory module comprises:

a dual in-line memory module (DIMM);

a first sheet covering a first side of the DIMM;

a second sheet covering a second side of the DIMM opposite the first side such that the DIMM is positioned between the first sheet and the second sheet; and a clip inserted into a gap formed at a top side of the memory module between the first sheet and the second sheet.

* * * * *